(12) United States Patent
Tsukamoto et al.

(10) Patent No.: US 7,079,413 B2
(45) Date of Patent: Jul. 18, 2006

(54) SEMICONDUCTOR MEMORY DEVICE WITH BACK GATE POTENTIAL CONTROL CIRCUIT FOR TRANSISTOR IN MEMORY CELL

(75) Inventors: Yasumasa Tsukamoto, Hyogo (JP); Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 101 days.

(21) Appl. No.: 10/812,403

(22) Filed: Mar. 30, 2004

(65) Prior Publication Data

US 2004/0252548 A1 Dec. 16, 2004

(30) Foreign Application Priority Data

Mar. 31, 2003 (JP) .............................. 2003-095050

(51) Int. Cl.
*G11C 11/00* (2006.01)

(52) U.S. Cl. .................. 365/154; 365/189.09; 365/226

(58) Field of Classification Search ................ 365/154, 365/156, 189.09, 226, 227; 327/534–536, 327/544–546
See application file for complete search history.

(56) References Cited

U.S. PATENT DOCUMENTS 5,900,665 A * 5/1999 Tobita ........................ 257/357
6,046,627 A * 4/2000 Itoh et al. .................... 327/546
6,603,345 B1 * 8/2003 Takahashi .................... 327/534
6,862,227 B1 * 3/2005 Yamaoka et al. ......... 365/189.09

FOREIGN PATENT DOCUMENTS

| JP | 09-73784 | 3/1997 |
|---|---|---|
| JP | 10-178110 | 6/1998 |
| JP | 11-213673 | 8/1999 |
| JP | P2001-339071 | 12/2001 |
| JP | P2003-60089 | 2/2003 |

OTHER PUBLICATIONS

Hiroshi Kawaguchi et al., "Dynamic Leakage Cutt-Off Scheme for Low-Voltage SRAM's", IEEE 1998 Symposium on VLSI Circuits Digest of Technical Papers, pp. 140-141.

* cited by examiner

*Primary Examiner*—Gene N. Auduong
(74) *Attorney, Agent, or Firm*—McDermott Will & Emery LLP

(57) ABSTRACT

A substrate potential setting circuits are provided which control substrate potentials in units of columns of a memory cell array at least in data writing. Upon data writing, the potential of the substrate region of memory cell transistors on a selected column is changed to reduce the data holding characteristics (static noise margin) to ensure high-speed data writing to the memory cells. Data writing is performed at high speed without impairing stability of data retention.

17 Claims, 28 Drawing Sheets

MCa

SEMICONDUCTOR MEMORY DEVICE WITH BACK GATE POTENTIAL CONTROL CIRCUIT FOR TRANSISTOR IN MEMORY CELL

BACKGROUND OF THE INVENTION

1. Field of the Invention

The present invention relates to semiconductor memory devices, and particularly to a configuration of a memory cell array portion of a static type memory (static random access memory; SRAM) operating statically. More particularly, the present invention relates to a configuration of an SRAM capable of writing and reading data in a stable manner with a reduced current dissipation.

2. Description of the Background Art

One approach of increasing an operating speed of a MOS transistor (insulated gate type field effect transistor) is to reduce the absolute value of a threshold voltage of the transistor. With a smaller absolute value of the threshold voltage, the drain current of the MOS transistor increases, so that it is possible to charge and discharge an internal node at high speed.

When the absolute value of the threshold voltage is made small, however, the source-drain leakage current (sub-threshold current) in an off state increases, leading to an increased current dissipation. Various approaches have been proposed to resolve a problem of such leakage current.

Japanese Patent Laying-Open No. 9-73784 (referred to as patent publication reference 1) describes a semiconductor memory device wherein, in a static type memory cell circuit, a source-substrate (back gate) voltage of a memory cell transistor is changed between the period at the standby and the period of an operation for data accessing. Specifically, during the standby state, the source-substrate voltage of a memory cell MOS transistor is set to a deep reverse bias state and the absolute value of the threshold voltage of the MOS transistor is increased to reduce a leakage current. During the operation, the source and the substrate are kept at the same potential, and the absolute value of the threshold voltage is decreased compared to that at the standby state to achieve a high speed operation. The configuration described in this prior art document aims at increasing the operating speed of the memory while decreasing the current dissipation in a non-operation state (at the standby).

Further, a configuration for speeding up an operation and reducing the current consumption by controlling substrate potentials of a plurality of memory cells individually is described in an article by Kawaguchi et al, titled "Dynamic Leakage Cut-off Scheme for Low-Voltage SRAM's", IEEE 1998 VLSI Circuits Symposium (referred to as non-patent publication reference 1). In the configuration described in this article, in the memory array having memory cells arranged in rows and columns, substrate power supply lines are arranged in the row direction, and the substrate potentials are controlled in units of memory cell rows. Specifically, the substrate potential and the source potential of the memory cell transistors of the memory cell row selected by a row decoder are set to equal potentials to speed up the operation. The substrate potential of the memory cell transistors in a non-selected row is set to a potential at which the source and back gate are set in a reverse bias state to reduce the leakage current in the non-selected memory cells.

Further, as a way of accelerating data writing, a configuration changing substrate potentials of memory cell transistors is disclosed in Japanese Patent Laying-Open No. 11-213673 (referred to as patent publication reference 2). In this reference, the substrate potentials of the transistors of inverter circuits constituting a flip-flop of a static type memory cell are controlled. Specifically, at the beginning of a writing operation, the substrate potentials of the memory cell transistors are so set as to decrease the current driving capabilities of load P channel MOS transistors and drive N channel MOS transistors. In the configuration described in this reference, a substrate potential setting circuit is provided for each memory cell row, and the substrate potentials of the memory cell transistors are adjusted in units of rows.

Layouts for reducing an area of an SRAM cell array are described in Japanese Patent Laying-Open Nos. 10-178110, 2003-60089 and 2001-339071 (referred to as "patent publication references 3, 4 and 5, respectively).

In each of the configurations described in the aforementioned patent publication reference 1 and non-patent publication reference 1, the substrate potential is controlled to be different for an operation of a data accessing to the memory cell and for the standby state (in a non-selected state) to achieve speed up of an operation and reduction of current consumption. In these conventional configurations, however, the absolute values of the threshold voltages of both P and N channel MOS transistors of the memory cell are reduced during the operation to increase the current driving capabilities of the transistors. Thus, although the bit line current-can be discharged at high speed in data reading and the reading operation can be speeded up, for data writing, significant speed-up of writing operation would not be expected so much. In data writing, one and the other bit lines of a bit line pair are strongly driven to an H level and an L level, respectively, by a write driver arranged outside the array, in accordance with data to be written. Data storage nodes of the memory cell are each set to a voltage level in accordance with the write data. In writing of reverse data of the held data, data writing is performed by inverting the H level side node of the storage nodes is inverted to an L level. At this time, when the current driving capability of the PMOS load transistors is large, it is not possible to invert the held data. Thus, it is preferable from the standpoint of high-speed and stable data writing that the current driving capability of the PMOS load transistor is as small as possible compared to that of the NMOS access transistor in a memory cell to which data is to be written. These conventional approaches fail to consider a configuration for writing data at high speed. Consideration is conventionally paid merely to reduction of an absolute value of the threshold voltage of the memory cell transistor during an operation to speed up the operation of the memory cell transistors.

In the above-described patent publication reference 2, the substrate potential setting circuit is arranged for each memory cell row, and substrate potentials of the memory cell transistors are controlled in units of rows. With this configuration, however, data held in the memory cell in a non-selected column may be destructed.

In an SRAM cell, stability of data retention is given quantitatively by characteristic curves obtained by inverting and superimposing input and output transfer characteristic curves of an inverter. A larger area of the region delimited by the two characteristic curves ensures more stable data retention. The area of this region is called a static noise margin (SNM). The static noise margin depends on an input logic threshold of the inverter, and thus, depends on current driving capabilities and threshold voltages of the MOS transistors constituting an SRAM cell. For example, in an SRAM cell of a full CMOS configuration, when a ratio between the current driving capability of an accessing N channel MOS transistor and the current driving capability of a driving N channel MOS transistor becomes small, a potential of an L level storage node is likely to rise upon connection to a bit line. The static noise margin decreases, and the stability of data retention is reduced. In other words, data held in the memory cell is destructed, thereby causing a malfunction. This ratio of the current driving capabilities is generally called a 0 ratio, which is normally set to more than 1.5 to secure the static noise margin. In other words, it is necessary to set the current driving capability of the drive transistor higher than that of the access transistor.

In an SRAM, it is important to secure the static noise margin to ensure stability of data retention. If the substrate potentials are controlled to reduce the current driving capability of the drive transistor at the start of data writing operation, as in the configuration of the above-described patent publication reference 2, the static noise margin is reduced and is advantageous for data writing. In this approach, storage nodes of the memory cells in a selected row and in non-selected columns are also connected to the corresponding bit lines. Thus, when the substrate potentials are controlled to reduce the current driving capabilities of the drive transistors of the memory cells in units of memory cell rows, the static noise margin would decrease also in the memory cells in the selected row and in the non-selected columns. This may destruct the memory cell data in the non-selected columns and hence cause a malfunction.

In each of the conventional techniques, although reduction of current consumption at the standby is considered, reduction of active current due to charge/discharge of bit lines during an operation is given no consideration.

Further, the above-described patent publication references 3–5 each consider only the layout of the memory cells, and give no consideration on circuit characteristics such as reduction of current consumption.

SUMMARY OF THE INVENTION

An object of the present invention is to provide a semiconductor memory device capable of achieving high-speed and stable data reading and writing with reduce current dissipation.

Another object of the present invention is to provide a semiconductor memory device capable of reducing current consumption during an operation without impairing high-speed operability.

A semiconductor memory device according to the present invention includes: a plurality of memory cells, arranged in rows and columns, each including a latch circuit formed of insulated gate type field effect transistors of first and second conductivity types; and a substrate potential changing circuit for changing a back gate potential of at least the insulated gate type field effect transistor of the first conductivity type of a selected memory cell for a data writing operation and for a data reading operation in response to, an address signal and an operation mode designating signal.

Changing the back gate potential of a memory cell transistor for the data writing operation and for the data reading operation allows the threshold voltage of the memory cell transistor to be changed in accordance with an operation mode. Since the threshold voltage of the memory cell transistor is changed in accordance with an operation mode, the static noise margin of the memory cell can be optimized in accordance with an operation margin, and thus, stable and high-speed data writing and reading can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
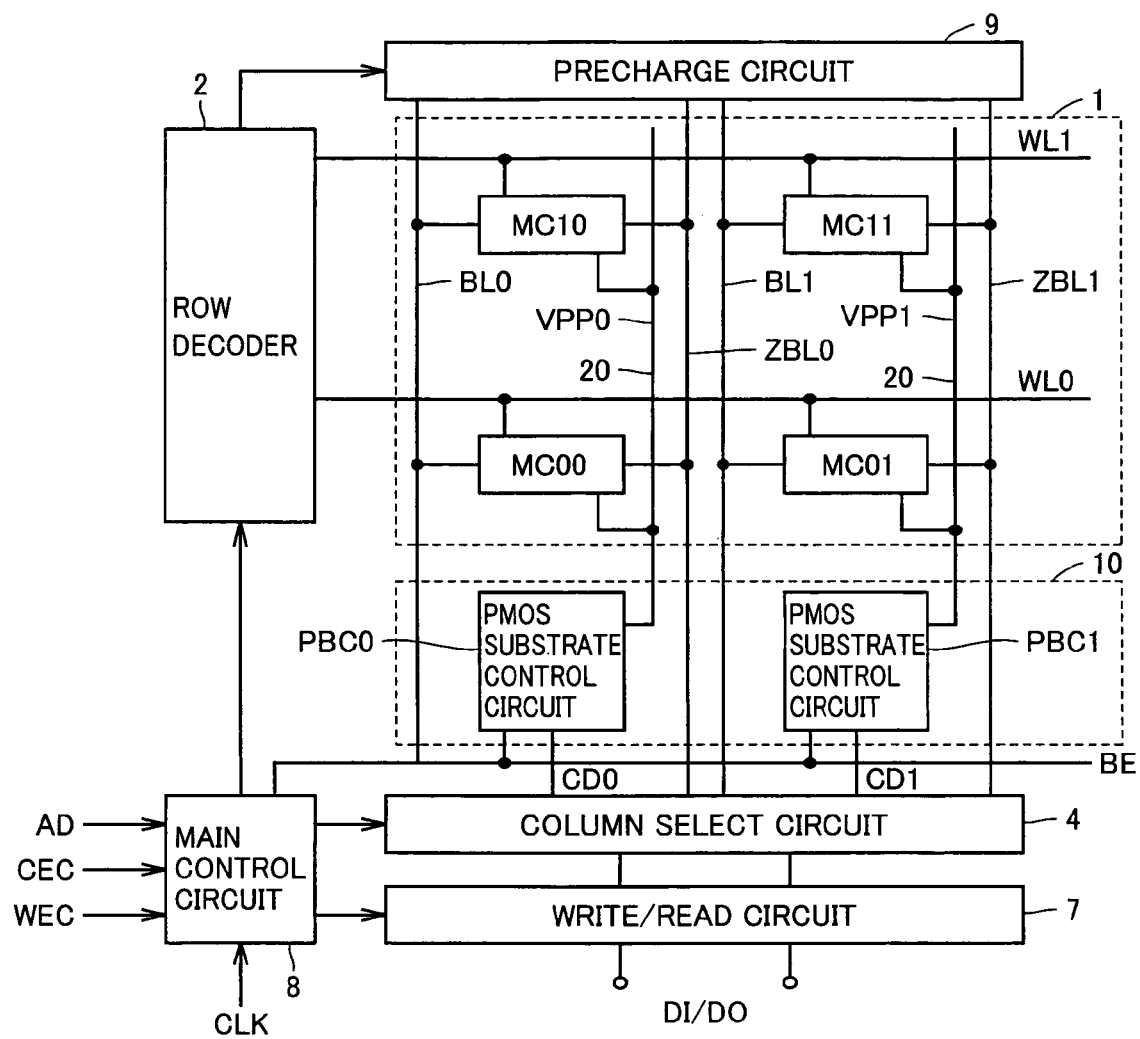
FIG. 1 schematically shows an overall configuration of a semiconductor memory device according to the present invention.

FIG. 1 schematically shows by way of example an overall configuration of the semiconductor memory device according to the present invention. FIG. 1 shows a configuration of a synchronous type single port SRAM that operates in synchronization with a clock signal. The configuration of the SRAM according to the present invention, however, is not limited thereto. It may be an SRAM operating in accordance with a chip select signal and asynchronously to the clock signal, or may be a dual port SRAM.

Referring to FIG. 1, the semiconductor memory device includes a memory cell array 1 having a plurality of memory cells arranged in rows and columns, a row decoder 2 for decoding an applied row address signal to generate a word line select signal, a column select circuit 4 for decoding an applied Y address signal to generate a column select signal CD for selecting a column of memory cell array 1 and connecting the selected column to an internal data line, a write/read circuit 7 performing data writing and reading with respect to the column selected by column select circuit 4, and a main control circuit 8 receiving externally supplied cell enable signal /CEC, write enable signal /WEC and address signal AD, and generating internal row and column address signals and necessary internal operation control signals in accordance with a clock signal CLK.

In memory cell array 1, SRAM cells MC are arranged in rows and columns. In FIG. 1, memory cells MC00, MC01, MC10 and MC11 arranged in two rows and two columns are shown representatively. The SRAM cell is of a full CMOS configuration, and has a threshold voltage of the memory cell transistor changed in accordance with a change of back gate potential. In each column, memory cell transistors of the same conductivity type are formed in a common substrate region, and this substrate region functions as the back gates of the memory cell transistors.

The semiconductor memory device further includes a substrate potential setting circuit (substrate potential changing circuit) 10 which changes the substrate (back gate). potentials of the transistors of the memory cells in a selected column in accordance with a substrate potential control signal BE from main control circuit 8 and column select signal CD from column select circuit 4. Substrate potential setting circuit 10 includes substrate potential control circuits PBC provided corresponding to the respective columns of memory cell array 1. Substrate potential control circuit PBC provided for the selected column changes the substrate potentials of the memory cell transistors between a data write cycle, a data read cycle and a standby cycle (at the standby). Particularly, in data writing, the static noise margin of the memory cell in the selected column is reduced to ensure high-speed and reliable data writing.

Substrate potential setting circuit 10 does not change the substrate potentials for a non-selected column. Thus, in the non-selected column, the static noise margin is maintained in a sufficiently large state, so that data is held stably.

Substrate potential setting circuit 10 includes PMOS substrate potential control circuits PBC0 and PBC1, . . . , arranged for the respective memory cell columns. In the first embodiment, the substrate potential of the P channel MOS transistors of memory cell MC (representative of the memory cells) is changed in accordance with an operation mode. Thus, a substrate voltage transmission line 20 is arranged in parallel with bit lines BL and ZBL in each column. Substrate voltage transmission lines 20 each transmit a substrate voltage VPP. These substrate voltage transmission lines 20 are each connected commonly to the back gates (substrate regions) of the P channel MOS transistors of the memory cells in a corresponding column.

In FIG. 1, substrate voltage transmission line 20 arranged for memory cells MC00 and MC10 connected to bit lines BL0 and ZBL0 transmits a substrate voltage VPP0, while substrate voltage transmission line 20 arranged for memory cells MC01 and MC11 connected to bit lines BL1 and ZBL1 transmits a substrate potential VPP1.

A word line WL is arranged corresponding to each row of the memory cells. Memory cells MC10 and MC11 are connected to a word line WL1, while memory cells MC00 and MC01 are connected to a word line WL0.

Write/read circuit 7 inputs and outputs external data DI and DO, respectively, under the control of main control circuit 8.

A precharge circuit 9 is provided for bit lines BL and ZBL, which precharges the bit lines to a prescribed potential in accordance with a word line select timing signal applied via row decoder 2. By precharge circuit 9 provided for bit lines BL and ZBL (representatively indicating the bit lines), a column current flows into the bit lines in data reading. Through discharging of the column current via the memory cell, a potential difference depending on the stored data in the memory cell occurs between the bit lines.

Figure 2:
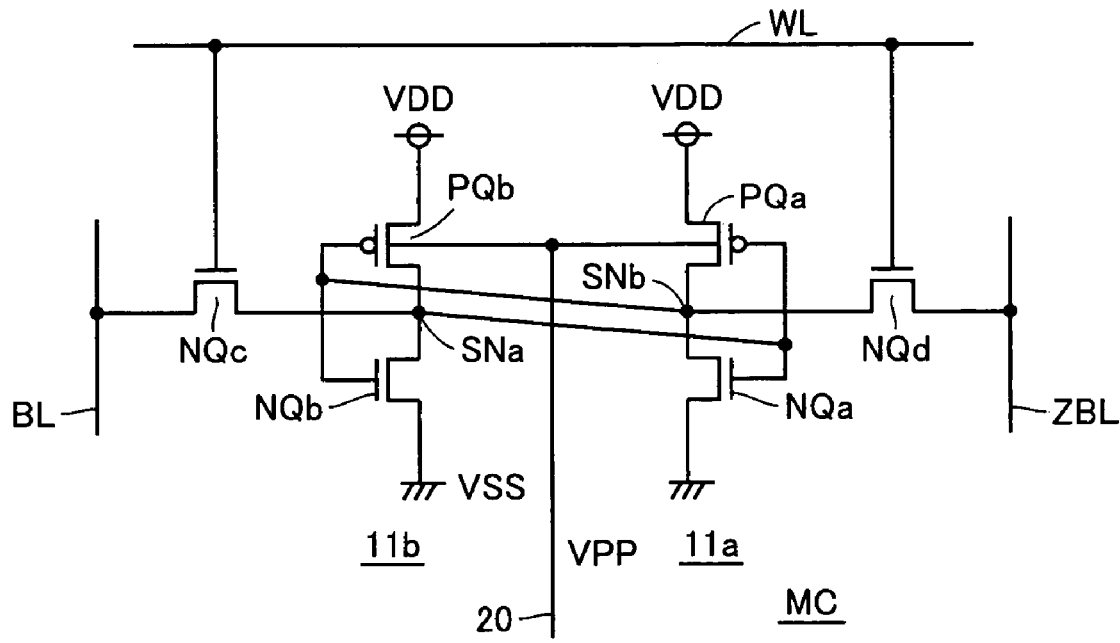
FIG. 2 shows the configuration of the memory cell shown in FIG. 1 in more detail.

FIG. 2 shows more specifically the configurations of memory cells MC00–MC11 shown in FIG. 1. Since memory cells MC00–MC11 each have the same configuration, the configuration of memory cell MC is shown representatively in FIG. 2.

Memory cell MC includes inverters 11a and 11b constituting an inverter latch for storing data, and N channel MOS transistors NQc and NQd coupling storage nodes SNa and SNb to bit lines BL and ZBL, respectively, in accordance with a word line select signal on word line WL.

Inverter 11a drives storage node SNb in accordance with the stored data on storage node SNa, and inverter 11b drives storage node SNa in accordance with the potential of storage node SNb. Inverters 11a and 11b are CMOS inverters. Substrate voltage transmission line 20 is coupled commonly to the back gates of the P channel MOS transistors of the CMOS inverters of the memory cells in the same column.

Inverter 11a includes a P channel MOS transistor PQa connected between a power supply node supplying a power supply voltage VDD and storage node SNb and having its gate connected to storage node SNa, and an N channel MOS transistor NQa connected between storage node SNb and a ground node and having its gate connected to storage node SNa. Inverter 11b includes a P channel MOS transistor PQb connected between a power supply node supplying power supply voltage VDD and storage node SNa and having its gate connected to storage node SNb, and an N channel MOS transistor NQb connected between storage node SNa and a ground node and having its gate connected to storage node SNb. MOS transistors PQa and PQb have their substrate regions (back gates) commonly connected to substrate voltage transmission line 20.

Substrate voltage transmission line 20 is arranged separately from a memory cell power supply line transmitting a memory cell power supply voltage VDD. The memory power supply line and substrate voltage transmission line 20 have their voltage levels set independently from each other (substrate voltage transmission lines 20 have their voltage levels set in units of columns).

In the first embodiment, the back gates of N channel MOS transistors NQa, NQb, NQc and NQd are fixed to a ground voltage VSS, for example.

Accessing N channel MOS transistors NQc and NQd have their gates connected to word line WL, and, when conductive, they couple storage nodes SNa and SNb to bit lines BL and ZBL, respectively.

Figure 3:
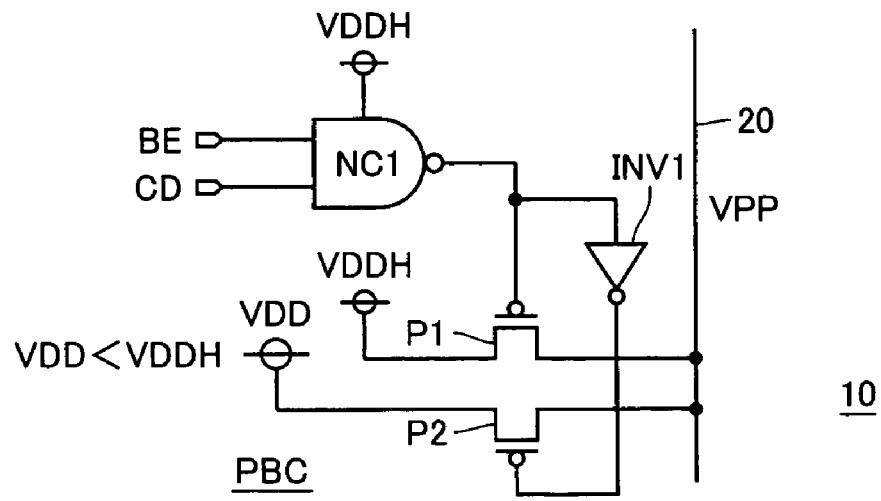
FIG. 3 shows a configuration of a substrate control circuit in the substrate potential setting circuit shown in FIG. 1.

FIG. 3 shows by way of example a configuration of a PMOS substrate control circuit PBC included in substrate potential setting circuit 10 according to the first embodiment of the present invention.

PMOS substrate control circuit PBC includes a NAND circuit NC1 receiving substrate potential control signal BE and column select signal CD from main control circuit 8, an inverter INV1 inverting an output signal of NAND circuit NC1, a P channel MOS transistor (pass transistor) P1 selectively rendered conductive in accordance with an output signal of NAND circuit NC1, to couple a voltage source VDDH to substrate voltage transmission line 20, and a P channel MOS transistor (pass transistor) P2 selectively rendered conductive in accordance with an output signal of inverter INV1, to couple a voltage source VDD to substrate voltage transmission line 20. A set of NAND circuit NC1, inverter INV1, and pass transistors P1 and P2 is arranged for each column of the memory cells.

The voltage VDDH supplied from voltage source VDDH is higher than the memory cell power supply voltage VDD supplied from voltage source VDD. Here, the voltage source and its supplying voltage are denoted by the same reference characters (the same applies to the following description). Memory cell power supply voltage VDD is 1.0 V, for example, and high voltage VDDH is 1.5 V, for example. High voltage VDDH may be generated by a boosting circuit used for driving a word line in a dynamic random access memory (DRAM), or a power supply voltage externally supplied for input/output interface may be employed. The power supply configuration is simplified. The interface power supply voltage is utilized as operating power supply voltages of an initial-stage input buffer of an input circuit and of a last-stage output buffer of an output circuit for interface with an outside.

NAND circuit NC1 has a level conversion function for converting the high level of the output signal to the high voltage VDDH level. When power supply voltage VDD is transmitted onto substrate voltage transmission line 20, the gate of pass transistor P1 is set to a high voltage level to maintain the pass transistor P1 in a non-conductive state. Substrate voltage transmission line 20 changes between power supply voltage VDD and high voltage VDDH, and thus, inverter INV1 does not particularly need a level conversion function, although it may have such level conversion function.

In PMOS substrate control circuit PBC shown in FIG. 3, when column select signal CD and substrate control signal BE are both at an H level, pass transistor P1 is rendered conductive, and high voltage VDDH is transmitted to substrate voltage transmission line 20. Accordingly, the load PMOS (P channel MOS) transistors of the memory cells in a selected column have their substrate biases deepened. When one of column select signal CD and substrate control signal BE is at an L level, pass transistor P2 is rendered conductive, and power supply voltage VDD is transmitted to substrate voltage transmission line 20. That is, the level of the voltage VPP on substrate voltage transmission line 20 is set by the signals CD and BE.

Figure 4:
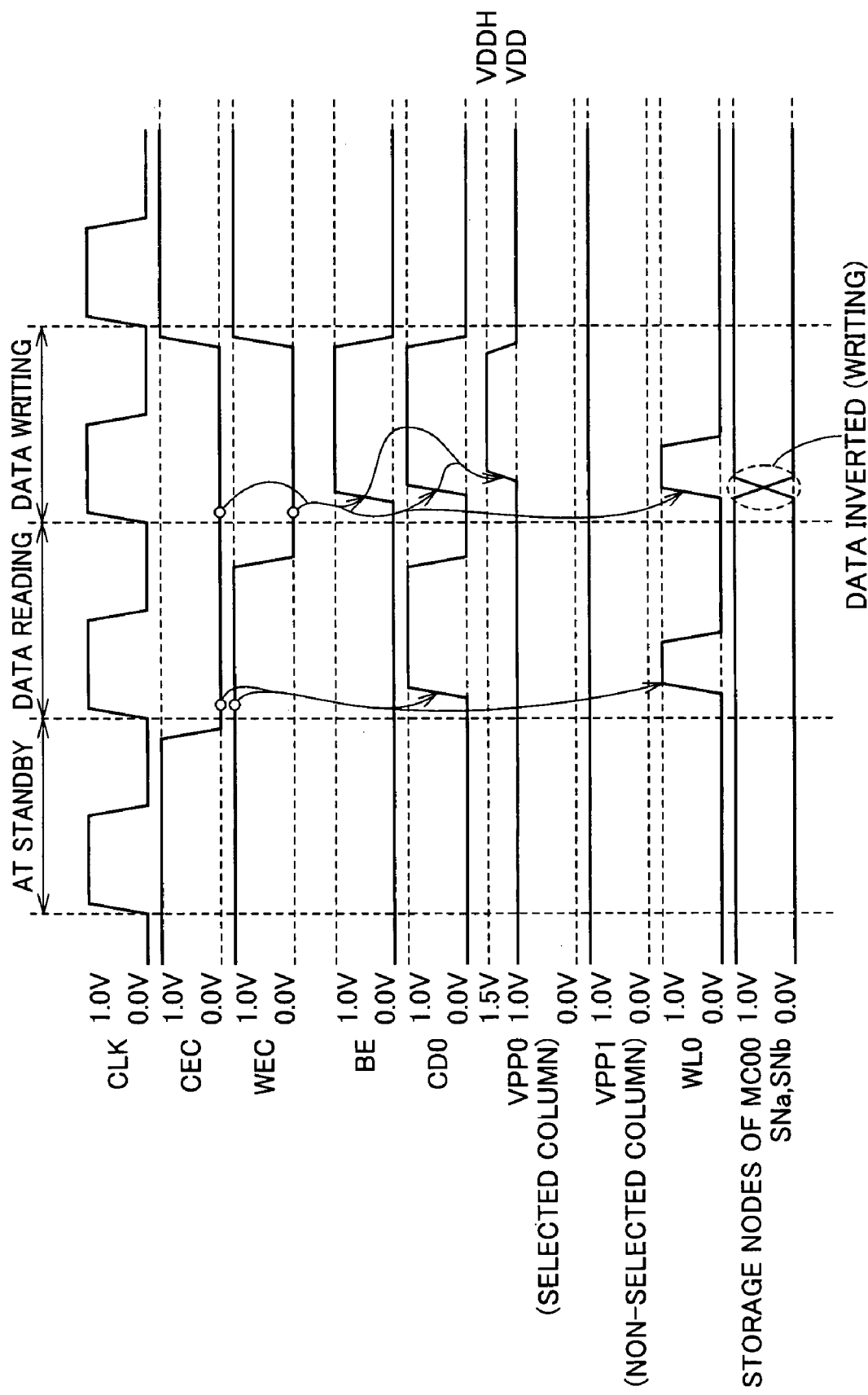
FIG. 4 is a timing chart representing an operation of the semiconductor memory device shown in FIG. 1.

FIG. 4 is a timing chart representing an operation of the semiconductor memory device according to the first embodiment of the present invention. Now, a substrate potential controlling operation of the semiconductor memory device shown in FIG. 1 is described with reference to FIG. 4.

The semiconductor memory device operates in synchronization with clock signal CLK. The amplitude of the internal signals is 1.0 V the same as power supply voltage VDD, with the H level thereof being 1.0 V and the L level thereof being VSS (0 V). High voltage VDDH is 1.5 V. The following three operation modes are prepared:

(a) standby state (non-operating state): CEC=H and WEC=X (don't care);
(b) read mode: CEC=L and WEC=H; and
(c) write mode: CEC=L and WEC=L.

When cell enable signal CEC is at an H level, the semiconductor memory device is in a non-selected state (standby state), and substrate control signal BE from main control circuit 8 is at an L level. Thus, the output signal of NAND circuit NC1 shown in FIG. 3 is at an H level, and in response, the output signal of inverter INV1 is at an L level. Accordingly, pass transistor P1 is in an off state, and pass transistor P2 is in an on state, and power supply voltage VDD from power source VDD is applied as voltage VPP on substrate voltage transmission line 20. This power supply voltage VDD is at the same voltage level as the memory cell power supply voltage, and P channel MOS transistors PQa and PQb shown in FIG. 2 have their sources and substrates (back gates) at the same voltage level, so that the absolute values of the threshold voltages are set small.

When an access cycle starts, cell enable signal CEC is set to an L level. When write enable signal WE is at an H level upon rising of the clock signal, the data read mode is designated. Row decoder 2 and column select circuit 3 shown in FIG. 1 perform the decoding operations under the control of main control circuit 8, and select signals corresponding to the row and column designated by address signal AD rise to an H level. Now, it is assumed that memory cell MC00 is designated. In this case, word line WL0 is driven to an H level by row decoder 2, and column select signal CD0 attains an H level, and storage nodes SNa and SNb of memory cell MC00 are connected to bit lines BL0 and ZBL0. The column current from precharge circuit 9 produces a potential difference between bit lines BL0 and ZBL0. This potential difference is transmitted via column select circuit 4 to write/read circuit 7, and then, output data DO corresponding to the data of the memory cell is generated for data reading out.

Selected word line WL0 is driven to a non-selected state after an elapse of a prescribed time period. When the sense operation of the memory cell data in write/read circuit 7 is completed, column select signal CD0 is also driven to a non-selected state.

In this data reading operation, substrate control signal BE is at an L level, and thus, the voltage VPP of substrate voltage transmission line 20 is at the power supply voltage VDD level in every column. In memory cell MC, the absolute value of the threshold voltage of each load PMOS transistor is small. The static noise margin is sufficiently secured, and thus, data can be read stably.

A data writing operation is now described. It is assumed again that memory cell MC00 is selected. In data writing, cell enable signal CEC and write enable signal WEC are both set to an L level. Main control circuit 8 activates row decoder 2 and column select circuit 4 in response to rising of clock signal CLK, and word line WL0 and column select signal CD0 are driven to an H level, as in the data reading operation.

In this data writing operation, main control circuit 8 drives substrate control signal BE to an H level. In the PMOS substrate control circuit PBC0 provided for the selected column, the output signal of NAND circuit NC1 shown in FIG. 3 attains an L level, and the output signal of inverter INV1 attains an H level. In response, voltage VDDH from high voltage source VDDH is transmitted via pass transistor P1 to substrate voltage transmission line 20 on the selected column.

In memory cell MC00, P channel MOS transistors PQa and PQb shown in FIG. 2 have their substrate biases made deeper to have increased absolute values of the threshold voltages, and the current driving capabilities thereof are weakened. Accordingly, the latch state of the inverter latch formed by inverters 11a and 11b becomes unstable. Write/read circuit 7 writes data to bit lines BL0 and ZBL0 of the selected column, and the potentials of bit lines BL0 and ZBL0 change in accordance with the written data. At this time, the latching capability of the inverter latch formed of inverters 11a and 11b is small, and the static noise margin of the memory cell is reduced. Thus, it is possible to readily set the potentials of storage nodes SNa and SNb to potential levels in accordance with the written data. Specifically, since the current driving capabilities of the PMOS transistors are made small, even in writing of reverse data, the voltage of the storage node storing the H level data can rapidly be driven to an L level in accordance with the data to be written.

For memory cells MC01 and MC11 on a non-selected column, the voltage VPP1 on substrate voltage transmission line 20 is the memory cell power supply voltage VDD from voltage supply VDD, and thus, the latching capability of the inverter latch is sufficiently high as in data reading, and data can be held stably. Thus, in a non-selected memory cell on the same row with the selected memory cell, even if the access transistors (NQc, NQd) are turned on and the storage nodes are connected to bit lines BL and ZBL, the non-selected memory cell can stably hold data.

Further, as for a memory cell in the same column as the selected memory cell, access transistors (NQc, NQd) are in an off state, and storage nodes SNa and SNb are isolated from corresponding bit lines BL and ZBL, and their potentials do not change. The reduction of the current driving capabilities of the load PMOS transistors does not affect the retention characteristics of the memory cell, and thus, it stores data stably.

When the data writing is completed, the output signal of NAND circuit NC1 attains an H level in response to falling of one of column select signal CD and substrate control signal BE, and again, power supply voltage VDD is transmitted to substrate voltage transmission line 20 of the selected column via pass transistor P2. Accordingly, the substrate biases of load PMOS transistors PQa and PQb shown in FIG. 2 become shallow again, and the latching capability of the inverter latch is increased. Accordingly, the static noise margin becomes high, and the written data is held stably.

In a selected column, the substrate biases of the P channel MOS transistors of the memory cell are made deep in data writing to reduce the latching capability of the memory cell. Thus, it is possible to readily set the potentials of the storage nodes in accordance with the write data. In the memory cell in a non-selected column, the substrate potentials of the load PMOS transistors are set at the same voltage level as in the data reading operation. Accordingly, the threshold voltages of the load PMOS transistors of the memory cell in the non-selected column are kept unchangedly to maintain the driving capabilities, so that the static noise margin of the memory cell is secured.

In data reading, the substrate bias is maintained at a shallow state, and thus, the static noise margin of the memory cell is secured sufficiently, enabling stable data reading.

Accordingly, in data writing, the substrate biases of the P channel MOS transistors of the memory cells in a selected column are deepened, and the absolute values of the threshold voltages are increased to reduce the current driving capabilities, so that the static noise margin can be made small. Thus, the reading and writing margins are sufficiently secured, enabling stable data retention and high-speed data writing.

It is noted that the voltage VDDH supplied from high voltage source VDDH may be at any level as far as the PN junction between the source impurity region and the substrate region of each of load PMOS transistors PQa and PQb in the memory cell is maintained in an off state.

Substrate control signal BE is kept active in the data writing operation at least during an active period of a selected word line, in accordance with write enable signal WEC, cell enable signal CEC and clock signal CLK. For such circuit configuration, a circuit utilizing an enabling signal of a write circuit included in write/read circuit 7 may be applied. A write enabling signal for enabling the internal write circuit is used as the substrate control signal. Substrate control signal BE may be generated from a combination of an activating signal of column select circuit 4 and the write enabling signal.

As described above, according to the first embodiment of the present invention, the substrate biases of the P channel MOS transistors of the memory cells in a selected column are deepened in accordance with a data write designating signal and a column select signal, and the static noise margin of a selected memory cell can be changed by changing the threshold voltages of the memory cell transistors. Accordingly, it is possible to readily write data without impairing stability of data retention.

Second Embodiment

Figure 5:
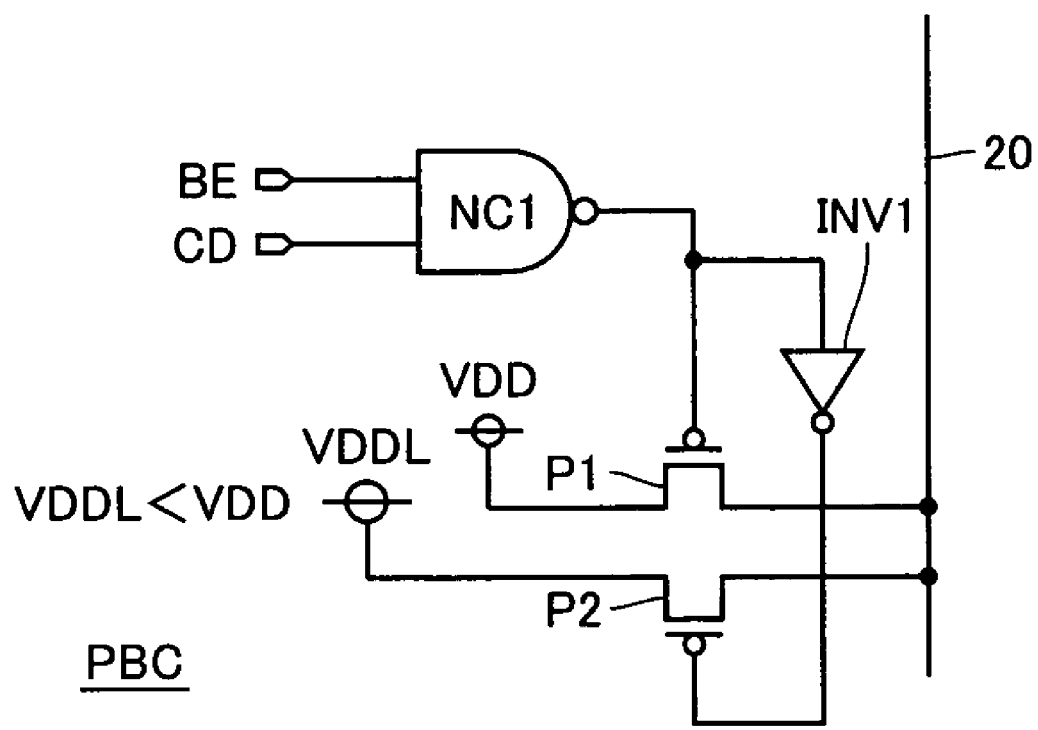
FIG. 5 shows a configuration of a substrate control circuit according to a second embodiment of the present invention.

FIG. 5 shows a configuration of a PMOS substrate control circuit PBC according to a second embodiment of the present invention. The PMOS substrate control circuit PBC shown in FIG. 5 differs from PMOS substrate control circuit PBC shown in FIG. 3 in the following point. Specifically, P channel MOS transistor (pass transistor) P1 is coupled to a power supply node supplying power supply voltage VDD, and pass transistor P2 is coupled to a low voltage source node VDDL. The other configuration of the PMOS substrate control circuit PBC shown in FIG. 5 is identical with that of PMOS substrate control circuit PBC shown in FIG. 3, and the corresponding portions are denoted by the same reference characters, and detailed description thereof is not repeated.

The overall configuration of the semiconductor memory device is identical to that of the semiconductor memory device shown in FIG. 1. The memory cell configuration is also identical to the configuration shown in FIG. 2.

The voltage VDDL of low voltage source VDDL is at a voltage level with which the PN junction between source and back gate of the load PMOS transistor of the memory cell maintains a non-conductive state. In other words, voltage VDD-VDDL is not greater than a built-in voltage (on the order of 0.7 V) of the PN junction. The low voltage source voltage VDDL is 0.5 V, for example.

This low voltage source voltage VDDL may be generated by lowering the power supply voltage VDD using a diode-connected MOS transistor. Alternatively, it may be generated using a down converting circuit such as a DC—DC converter, or it may be externally applied.

Figure 6:
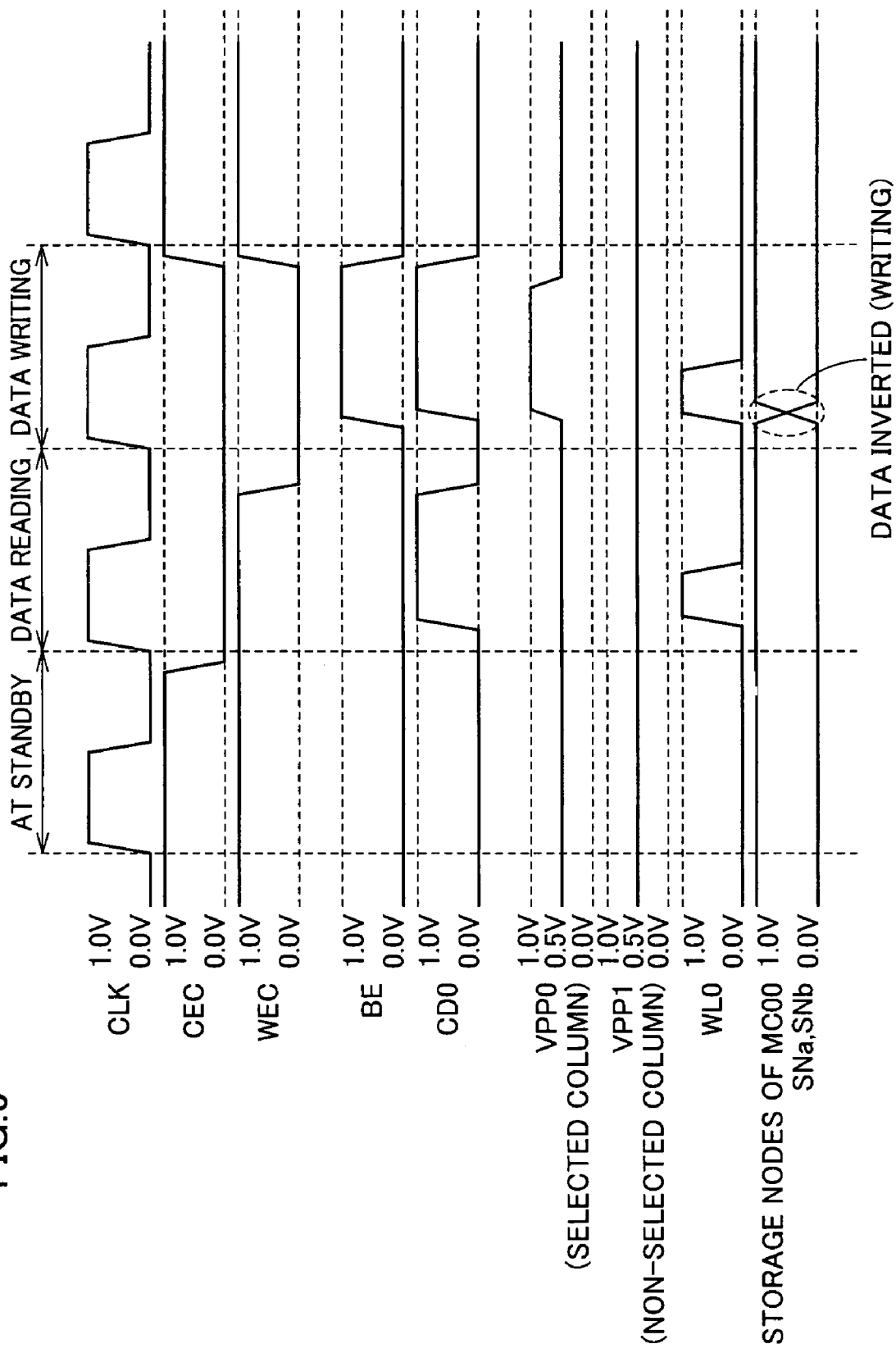
FIG. 6 is a timing chart representing an operation of the semiconductor memory device according to the second embodiment of the present invention.

FIG. 6 is a timing chart representing an operation in the case when the substrate control circuit PBC shown in FIG. 5 is employed. The timing chart shown in FIG. 6 differs from the timing chart shown in FIG. 4 only in the voltage level of voltage VPP transmitted to substrate voltage transmission line 20. The operations per se at the standby, in data reading and in data writing in the second embodiment are the same as those in the first embodiment, and thus, detailed description of the operations is not repeated. Voltage VPP of substrate voltage transmission line 20 is set to either the high voltage or the low voltage in accordance with substrate control signal BE and column select signal CD.

More specifically, in the second embodiment, the substrate potential VPP is set to a voltage level of power supply voltage VDD (1.0 V) at the standby (in the non-selected state) and in data reading. In data writing, voltage VPP of substrate voltage transmission line 20 arranged corresponding to a selected memory cell column is set to the low voltage source voltage VDDL, and the voltage VPP of substrate voltage transmission line 20 corresponding to a non-selected memory cell column is maintained at power supply voltage VDD.

Thus, in the second embodiment, as in the first embodiment, the substrate biases of the load PMOS transistors of the memory cells in a selected column are deepened in data writing to reduce the static noise margin of a selected memory cell. Accordingly, the data can be written at high speed and can also be held stably.

The voltages employed are power supply voltage VDD and voltage VDDL lower than VDD. Application of a voltage higher than power supply voltage VDD to pass transistors P1 and P2 is eliminated, and thus, the element reliability is ensured.

As described above, according to the second embodiment of the present invention, the voltage VPP of the substrate voltage transmission line is switched between power supply voltage VDD and low voltage VDDL. Thus, the data can be held stably and can be written at high speed, as in the first embodiment.

The maximum voltage applied is power supply voltage VDD, which ensures the reliability of the components.

Third Embodiment

Figure 7:
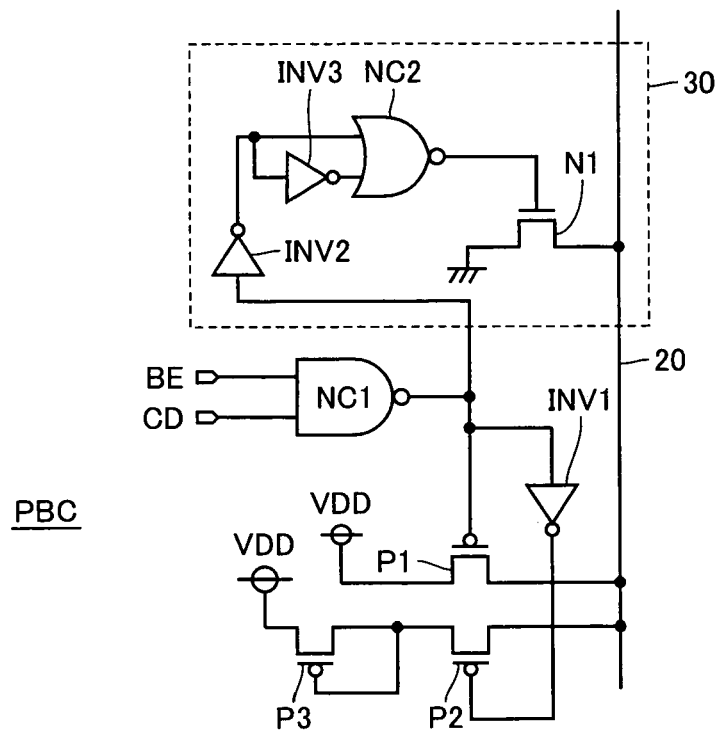
FIG. 7 shows a configuration of a substrate control circuit according to a third embodiment of the present invention.

FIG. 7 shows a configuration of a PMOS substrate control circuit PBC according to a third embodiment of the present invention. In the configuration of substrate control circuit PBC shown in FIG. 7, pass transistor P1 transmits power supply voltage VDD to substrate voltage transmission line 20 in accordance with an output signal of NAND circuit NC1. Pass transistor P2 is coupled to receive power supply voltage VDD via a diode-connected P channel MOS transistor P3, and transmits a voltage VDD-Vtp transmitted via P channel MOS transistor P3 to substrate voltage transmission line 20 in accordance with an output signal of inverter INV1. Here, Vtp indicates an absolute value of the threshold voltage of P channel MOS transistor P3.

When the high voltage of substrate bias voltage VPP is power supply voltage VDD and therefore, is 1.0 V, the absolute value Vtp of the threshold voltage of P channel MOS transistor P3 is set to 0.5 V. In this case, the low voltage of substrate bias voltage VPP is 0.5 V, as in the first embodiment. PMOS substrate control circuit PBC shown in FIG. 7 further includes an auxiliary driving circuit 30 that drives substrate voltage transmission line 20 toward a ground voltage level in response to rising of the output circuit of NAND circuit NC1.

Auxiliary driving circuit 30 include an inverter INV2 receiving the output signal of NAND circuit NC1, an inverter INV3 receiving an output signal of inverter INV2, a NOR circuit NC2 receiving output signals of inverters INV2 and INV3, and an N channel MOS transistor N1 rendered conductive when an output signal of NOR circuit NC2 is at an H level, to couple substrate voltage transmission line 20 to a ground node.

Inverters INV2 and INV3 and NOR circuit NC2 constitute a rise one-shot pulse generating circuit. When the data writing to a selected memory cell is completed, N channel MOS transistor N1 is driven one-shot, and discharges substrate voltage transmission line 20. Accordingly, the voltage of substrate voltage transmission line 20 is driven toward a low voltage at high speed, and after completion of the data writing, the substrate potentials of the P channel MOS transistors of the memory cells in the selected column are driven to an original voltage at high speed.

Figure 8:
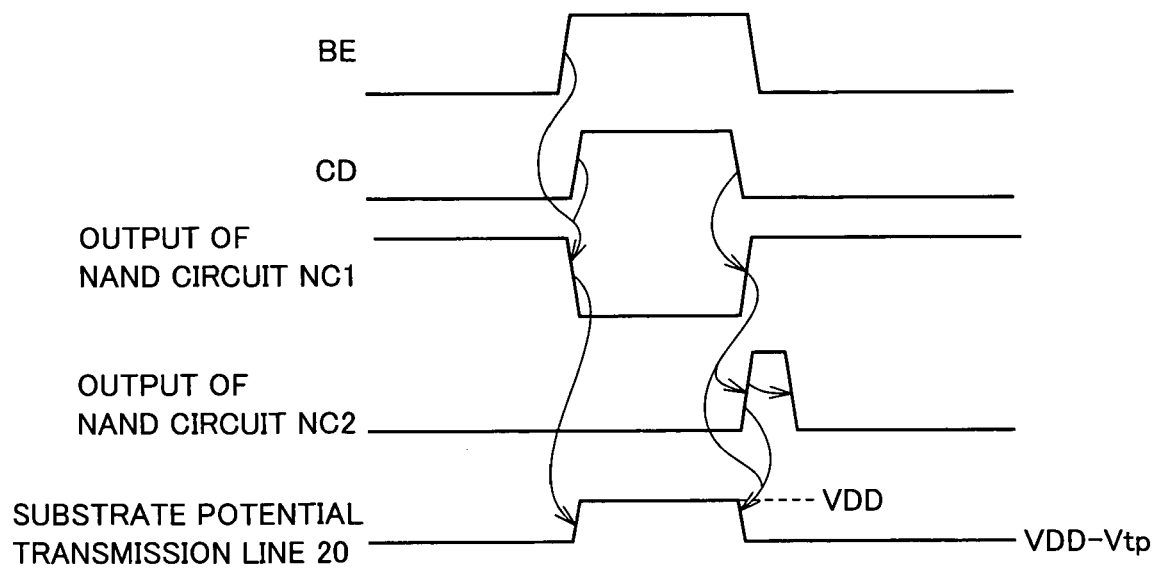
FIG. 8 is a signal waveform diagram representing an operation of the substrate control circuit shown in FIG. 7.

FIG. 8 is a signal waveform diagram representing an operation of auxiliary driving circuit 30 shown in FIG. 7. Now, the operation of the auxiliary driving circuit of FIG. 7 is described with reference to FIG. 8. Driving of substrate voltage transmission line 20 by pass transistors P1 and P2 is the same as in the operation represented in the timing chart of FIG. 6.

In data writing, when substrate control signal BE and column select signal CD both attain an H level, the output signal of NAND circuit NC1 falls to an L level, and pass transistor P1 enters an on state and pass transistor P2 enters an off state. Accordingly, power supply voltage VDD from power source VDD is transmitted to substrate voltage transmission line 20.

When the data writing is completed, and column select signal CD, for example, is driven to a non-selected state and the selected column is isolated from the internal write data line, then the output signal of NAND circuit NC1 attains an H level, and the output signal of inverter INV1 attains an L level. Pass transistor P1 enters an off state, and pass transistor P2 enters an on state, and accordingly, substrate voltage transmission line 20 is driven from power supply voltage VDD to the low voltage VDD-Vtp.

In this operation, the output signal of inverter INV2 attains an L level in response to falling of the output signal of NAND circuit NC1. Inverter INV3 has a long delay time, and its output signal is at an L level. The output signal of NOR circuit NC2 attains an H level in response to falling of the output signal of NAND circuit NC1, and N channel MOS transistor Ni is rendered conductive. Thus, substrate voltage transmission line 20 is driven towards a ground voltage by MOS transistor N1, and driven to low voltage VDD-Vtp in combination with the operation of pass transistor P2. Accordingly, substrate voltage transmission line 20 is driven from high voltage VDD to low voltage VDD-Vtp at high speed. After an elapse of the delay time of inverter INV3, the output signal of NOR circuit NC2 attains an L level, and MOS transistor N1 enters an off state.

Thus, it is possible to drive substrate voltage transmission line 20 from high voltage VDD to low voltage VDD-Vtp at high speed, by maintaining MOS transistor N1 in an on state for a prescribed time period after completion of the data writing. Substrate potential VPP can be restored to power supply voltage VDD even if the cycle of the clock signal is short, and accordingly, a fast and stable operation can be achieved.

Further, substrate voltage VPP is generated only with the memory cell power supply voltage. Since a single power supply is necessary for generating substrate voltage VPP, the configuration of the power supply can be simplified.

It is noted that the period of time during which auxiliary driving circuit 30 drives substrate voltage transmission line 20 may be set appropriately in accordance with the current driving capability of auxiliary driving circuit 30.

As described above, according to the third embodiment of the present invention, the substrate potential of a selected column is driven toward a ground voltage for a prescribed time period after completion of the data writing. Thus, the substrate potential can be restored to the original voltage level at high speed.

Further, the substrate low voltage is generated by down-converting the power supply voltage using the diode-connected MOS transistor. Thus, the substrate voltages can be generated with a single power source.

It is noted that auxiliary driving circuit 30 for driving the substrate voltage one-shot may be combined with the configuration of the first or second embodiment.

Fourth Embodiment

Figure 9:
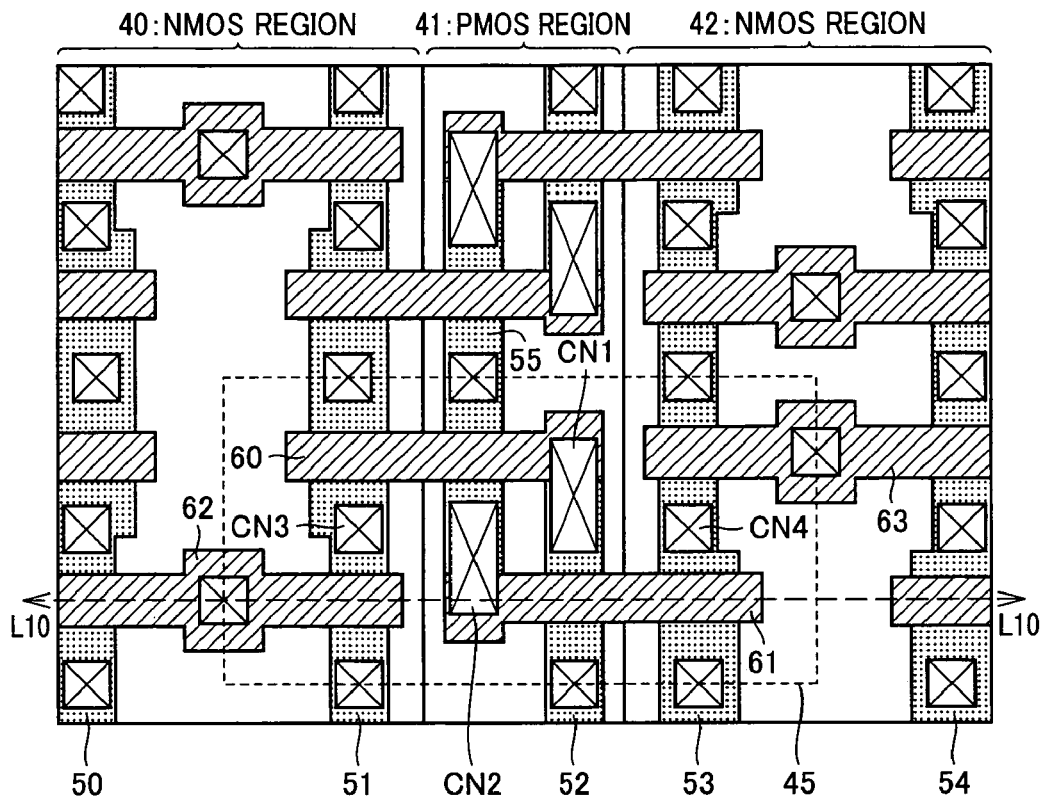
FIG. 9 schematically shows two-dimensional layout of memory cells according to a fourth embodiment of the present invention.

FIG. 9 schematically shows layout of memory cells of a semiconductor memory device according to a fourth embodiment of the present invention. Referring to FIG. 9, NMOS regions 40 and 42 for forming N channel MOS transistors are arranged on both sides of a PMOS region 41 for forming P channel MOS transistors. These MOS regions 40–42 are arranged continuously and linearly extending in the column direction, and memory cells arranged to be aligned in a column are formed in these regions.

In PMOS region 41, active regions 52 and 55 for forming P channel MOS transistors are formed in rectangular shapes. These active regions 52 and 55 are each shared by neighboring memory cells in the column direction.

In NMOS region 40, N type active regions 50 and 51 for forming N channel MOS transistors are formed extending linearly. In NMOS region 42, N type active regions 53 and 54 for forming N channel MOS transistors are formed, spaced apart from each other, to extend linearly in the column direction. In FIG. 9, the region corresponding to one-bit memory cell is shown as a rectangular region 45 delineated by a broken line.

In this one-bit memory cell region 45, a gate electrode 60 is arranged extending in the row direction across active regions 51 and 55, and is connected to active region 52 via a contact CN1. A gate electrode 61 is arranged, in the point symmetrical form to gate electrode 60, to extend in the row direction across active regions 52 and 53. Gate electrode 61 is connected to active region 55 via a contact CN2. These gate electrodes 60 and 61 constitute P channel and N channel MOS transistors forming the CMOS inverter latch. Gate electrodes 60 and 61 are connected to active regions 52 and 55 via contacts CN1 and CN2, respectively, to implement cross-connection of storage nodes of the CMOS inverters.

A gate electrode 62 is formed across active region 51, opposing to gate electrode 60 via a contact CN3. A gate electrode 63 is formed across active region 53, opposing to gate electrode 61 via a contact CN4. Gate electrodes 62 and 63 are connected to a word line, as will be described later, and constitute gates of access transistors. Gate electrodes 62 and 63 are each shared by adjacent memory cells in the row direction. The layout of one-bit memory cell region 45 is repeatedly arranged in mirror symmetry in row and column directions.

With NMOS regions 40 and 42 and PMOS region 41 extending linearly in the column direction, it is possible to control the substrate potential of PMOS region 41 in a unit of column.

Figure 10:
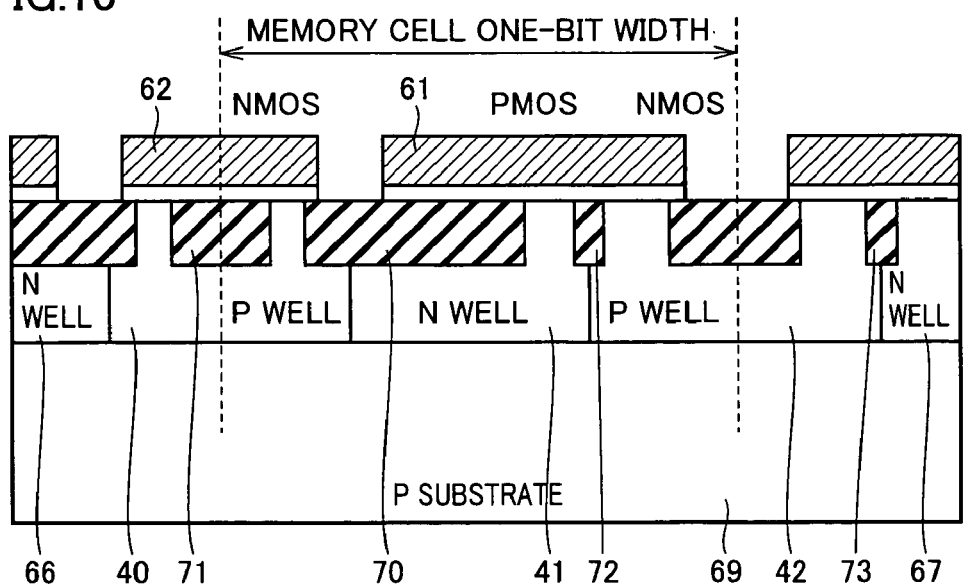
FIG. 10 schematically shows a cross-sectional structure taken along the line L10—L10 shown in FIG. 9.

FIG. 10 schematically shows a cross sectional structure taken along the line L10–L10 shown in FIG. 9. Referring to FIG. 10, memory cells are formed on a P type (silicon) substrate 69. NMOS region 40, PMOS region 41 and NMOS region 42 are delimited by P well, N well and P well, respectively, and thus, the MOS regions and the corresponding well regions are denoted by the same reference characters. N wells 66 and 67 for forming P channel MOS transistors of adjacent memory cells are formed on the outsides of P wells 40 and 42, respectively.

Trench regions 70–73 are formed in wells 40–42, 66 and 67, for isolation of elements. Trench regions 70–73 are shallow trench isolation (STI) regions, which are formed by filling the trench regions formed on the well surfaces with insulating films. Active regions 50–54 are impurity regions. FIG. 10 shows the cross sectional structure along the gate electrode 61 of FIG. 9, and the channel regions are formed, and the impurity regions forming the active regions are not shown in the figure.

Gate electrode 61 is arranged extending over N well 41 and P well 42. Gate electrode 62 is formed above P well 40, over trench region 71. Thus, the STI films are used for isolation of transistors, and active regions 50–54 are isolated by the STI regions.

N well 41 constitutes the substrate regions of the P channel MOS transistors of the memory cell. The potential of N well 41 is set depending on whether a corresponding column is selected in data writing.

Figure 11:
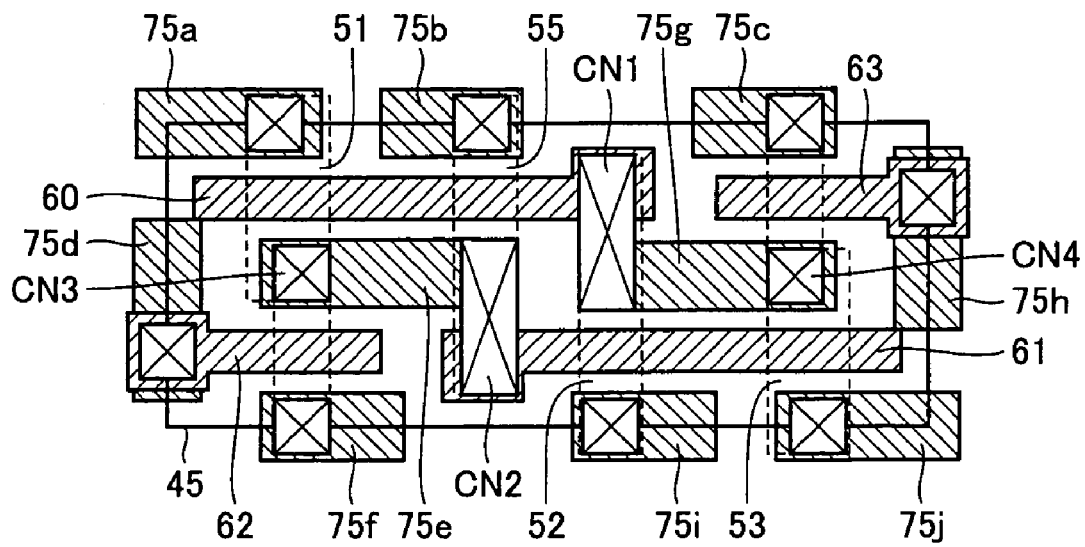
FIG. 11 schematically shows layout of the first metal interconnections in the layout shown in FIG. 9.

FIG. 11 schematically shows layout of an upper layer interconnection of the memory cell shown in FIG. 9. Specifically, FIG. 11 shows the layout of the upper interconnection lines in the one-bit memory cell region 45. Active region 51 is coupled to active region 55 via contact CN3, a first metal interconnection line 75e and contact CN2. In a region opposite to first metal interconnection line 75e with respect to gate electrode 60, active region 51 is connected to a first metal interconnection line 75a via a contact, and active region 55 is connected to a first metal interconnection line 75b via a contact. Gate electrode 62 is connected to a first metal interconnection line 75d via a contact. Further, in a region adjacent to gate electrode 62, active region 51 is connected to a first metal interconnection line 75f via a contact.

Active region 52 is coupled to active region 53 via contact CN1, a first metal interconnection 75g and contact CN4. In a region opposite to first metal interconnection line 75g with respect to gate electrode 61, interconnection lines 75i and 75j are formed to be coupled to active regions 52 and 53, respectively, via contacts. Gate electrode 63 is connected to a first metal interconnection line 75h via a contact.

First metal interconnection lines 75e and 75g each interconnect drains of the P channel and N channel MOS transistors constituting the CMOS inverter of the memory cell. The remaining first metal interconnection lines are used as intermediate interconnection lines for connection with second metal interconnection lines formed in a further upper layer.

Figure 12:
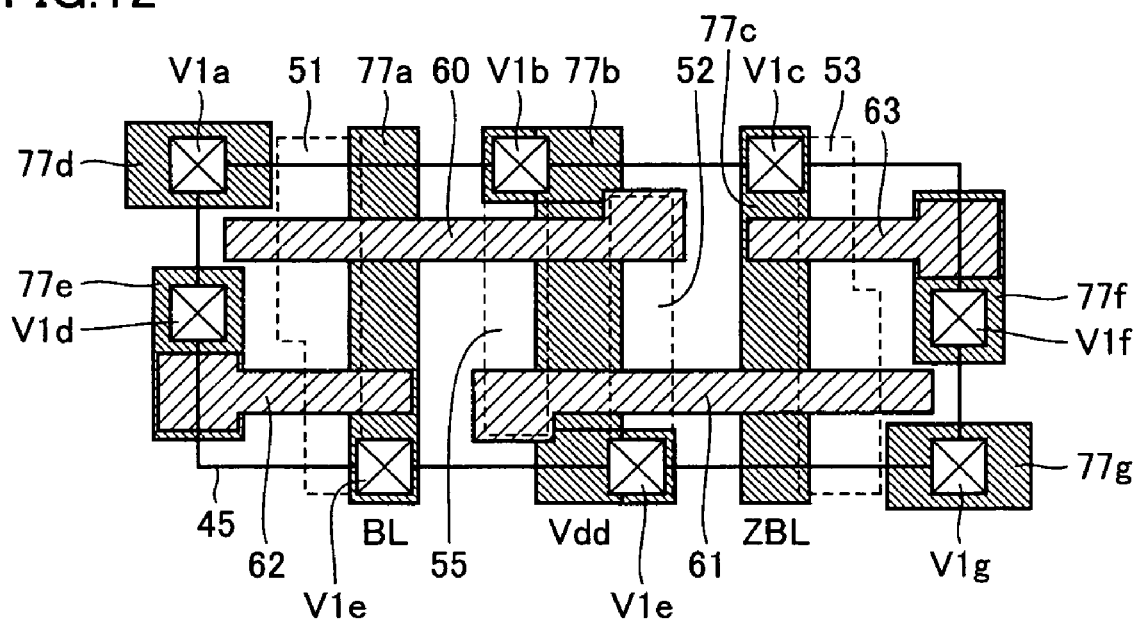
FIG. 12 schematically shows layout of the second metal interconnections in the layout shown in FIG. 9.

FIG. 12 shows layout of second metal interconnection lines of the memory cell array. The second metal interconnection lines shown in FIG. 12 are arranged on the first metal interconnection lines shown in FIG. 11. Referring to FIG. 12, a second metal interconnection 77a is placed to extend in the column direction adjacent to active region 51. Second metal interconnection line 77a is connected to first metal interconnection line 75f of FIG. 11 through a first via V1e. Second metal interconnection line 77a constitutes a bit line BL.

A second metal interconnection line 77b is placed extending in the column direction between active regions 55 and 52. Second metal interconnection line 77b is connected to first metal interconnection lines 75b and 75i of FIG. 11 through first vias V1b and V1e, respectively.

A second metal interconnection line 77c is placed adjacent to active region 53 and extending in the column direction. Second metal interconnection line 77c is connected to first metal interconnection line 75c of FIG. 11 through a first via V1c. Second metal interconnection line 77c constitutes a bit line ZBL.

Gate electrode 62 is connected to a second metal interconnection line 77e through first metal interconnection line 75d in FIG. 11 and a first via V1d. Gate electrode 63 is connected to a second metal interconnection line 77f through first metal interconnection line 75h of FIG. 11 and a first via V1f.

First metal interconnection line 75a shown in FIG. 11 is connected to a second metal interconnection line 77d through a first via V1a. Further, first metal interconnection line 75j shown in FIG. 11 is connected to a second metal interconnection line 77g through a first via V1g. Gate electrodes 60 and 61 are connected to the storage nodes in the memory cell, and thus, no first vias are provided.

Second metal interconnection line 77b extends in the column direction and transmits power supply voltage Vdd.

Figure 13:
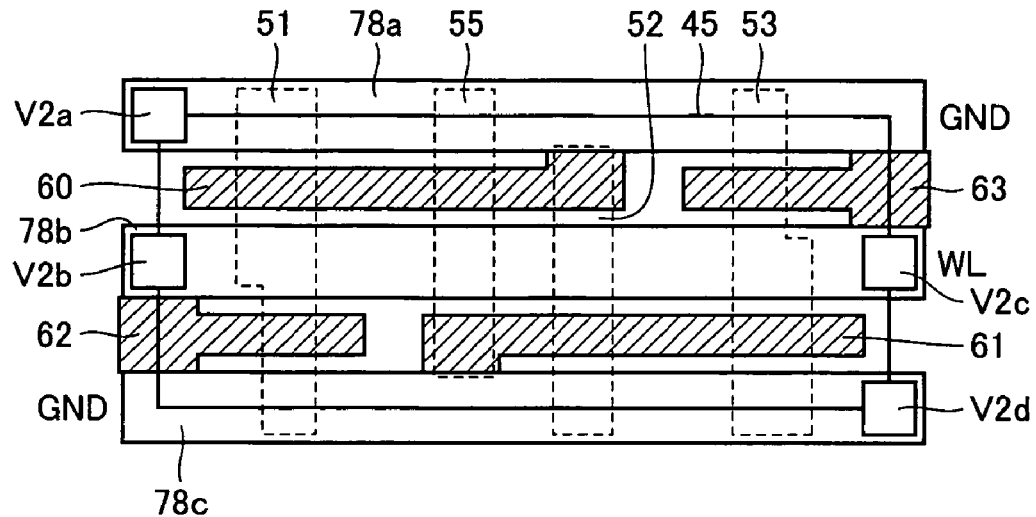
FIG. 13 schematically shows layout of the third metal interconnections in the layout shown in FIG. 9.

FIG. 13 schematically shows layout of third metal interconnection for a memory cell according to the fourth embodiment of the present invention. The third metal interconnection lines shown in FIG. 13 are arranged above the second metal interconnection lines shown in FIG. 12. Referring to FIG. 13, a third metal interconnection line 78a is placed in the row direction in parallel with gate electrodes 62 and 63. Third metal interconnection line 78a is connected to second metal interconnection line 77d shown in FIG. 12 through a second via V2a, and further connected to active region 51 via first metal interconnection 75a and the contact shown in FIG. 12. Third metal interconnection line 78a transmits ground voltage GND.

A third metal interconnection line 78b is placed extending in the row direction between gate electrodes 60, 63 and gate electrodes 62, 61. Third metal interconnection line 78b is connected to second metal interconnection lines 77e and 77f shown in FIG. 12 through second vias V2b and V2c. Third metal interconnection line 78b constitutes a word line WL, and coupled to gate electrodes of the accessing N channel MOS transistors formed in active regions 51 and 53.

A third metal interconnection line 78c is further placed extending in the row direction on the outsides of gate electrodes 62 and 61. Third metal interconnection line 78c is connected to second metal interconnection line 77g shown in FIG. 12 through a second via V2d. Third metal interconnection line 78c supplies ground voltage GND to the driving N channel MOS transistor formed in active region 53.

No third metal interconnection line is placed for active regions 52 and 55. The P channel MOS transistors formed in active regions 52 and 55 are supplied with the power supply voltage by second metal interconnection line 77b, as shown in FIG. 12.

As shown in FIGS. 9–13, N well 41 for forming P channel MOS transistors of the memory cell and P wells 40 and 42 for forming N channel MOS transistors are formed continuously extending in the column direction. P channel and N channel MOS transistors constituting the inverters of the memory cell are arranged adjacent to each other in the row direction, and the accessing N channel MOS transistors are arranged in a direction orthogonal to the inverters, to realize a lateral cell structure. Accordingly, the substrate potential of the memory cell arranged corresponding to the crossing point of a selected word line and the substrate region corresponding to a selected column can be changed so as to change the absolute value of the threshold voltage of load P channel MOS transistors of the memory cells on the selected column. This facilitates data writing to a selected memory cell.

Further, the power supply line transmitting power supply voltage VDD extends linearly in the column direction. Thus, it is possible to provide power supply voltage VDD of the memory cells in units of columns.

Figure 14:
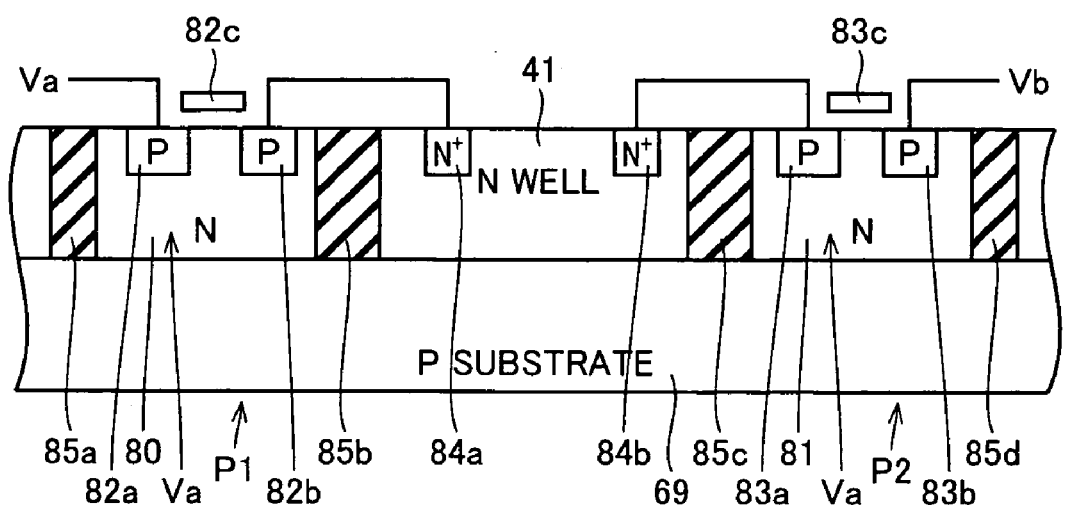
FIG. 14 schematically shows a cross-sectional structure of a main portion of the substrate control circuit according to the fourth embodiment of the present invention.

FIG. 14 shows a configuration of a main portion of the PMOS substrate control circuit. Referring to FIG. 14, N well 41 is formed on a P type substrate 69. P channel MOS transistors to be arranged in one column are formed in N well 41. N wells 80 and 81 are formed on a surface of P type substrate 69, isolated from N well 41 by element isolation regions 85b and 85c. N wells 80 and 81 are further isolated from other cell formation regions by element isolation regions 85a and 85d. A P channel MOS transistor (pass transistor) P1 for transmitting a high voltage Va is formed in N well 80. A P channel MOS transistor (pass transistor) P2 for transmitting a low voltage Vb is formed in N well 81.

Pass transistor P1 includes P type impurity regions 82a and 82b formed spaced apart from each other at the surface of N well 80, and a gate electrode 82c formed above a region between impurity regions 82a and 82b with a gate insulating film (not shown) interposed therebetween. Impurity region 82a is coupled to a high voltage source Va (VDD or VDDH). Impurity region 82b is coupled to an N type impurity region 84a formed at the surface of N well 41. N well 80 is biased to high voltage Va.

Pass transistor P2 includes P type impurity regions 83a and 83b spaced apart from each other formed at the surface of N well 81, and a gate electrode 83c formed above a region between impurity regions 83a and 83b with a gate insulating film (not shown) interposed. Impurity region 83b is coupled to a low voltage source Vb (VDD, VDDL or gate/drain of diode-connected MOS transistor). Impurity region 83a is coupled to an N type impurity region 84b formed at the surface of N well 41. N well 81 is biased to high voltage Va.

When P channel MOS transistor P1 is conductive, high voltage Va is supplied to N well 41 via N type impurity region 84a. When P channel MOS transistor P2 is conductive, low voltage Vb is supplied to N well 41 via N type impurity region 84b. Even when high voltage Va is supplied to N well 41, N well 81 is biased to high voltage Va, and thus, it is possible to prevent a current from flowing into N well 41 corresponding to the substrate region of P channel MOS transistor P2.

MOS transistors P1 and P2 are formed in N wells 80 and 81 isolated from each other, respectively with the well regions biased to high voltage Va, and isolation between high voltage source Va and low voltage source Vb can be reliably achieved.

N well 80 may be commonly provided for P channel MOS transistors P1 of the substrate potential control circuits provided for the respective columns n the substrate potential setting circuit. N well 81 may be commonly provided for P channel MOS transistors P2 of the substrate potential control circuits provided for the respective columns in the substrate potential setting circuit.

Figure 15:
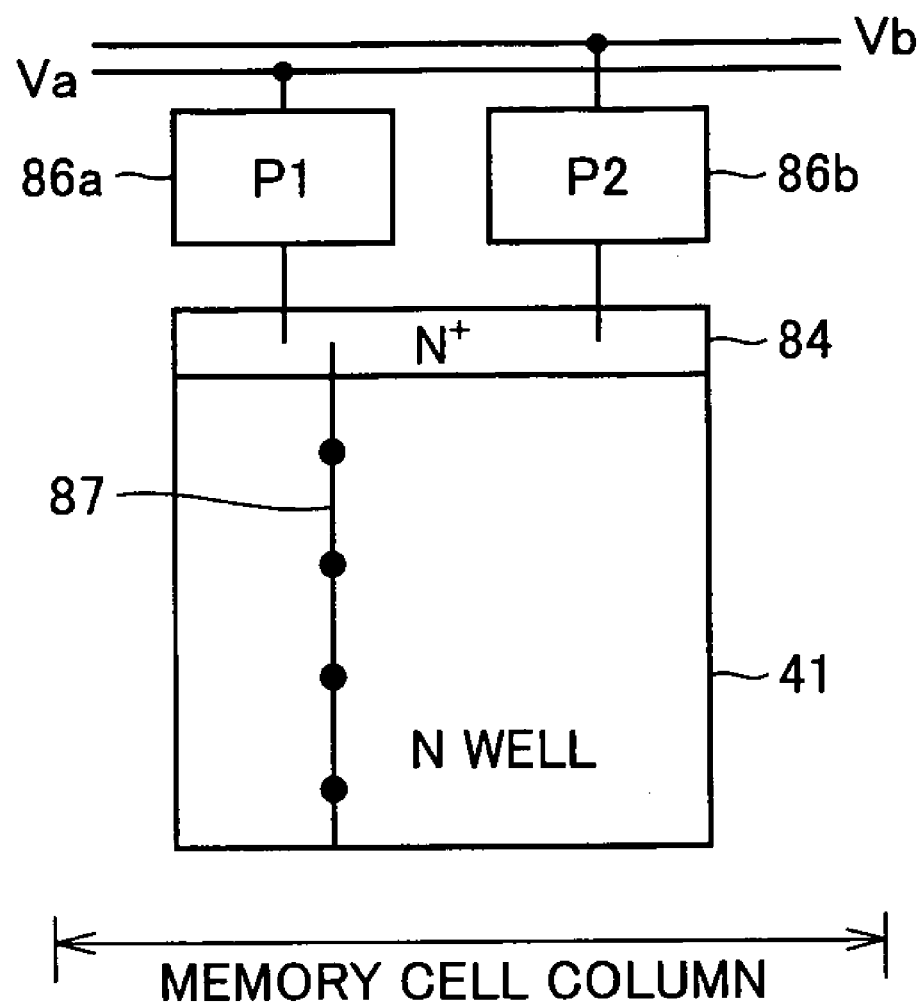
FIG. 15 shows another example of arrangement of the voltage applying portion of the substrate control circuit.

It is noted that, although MOS transistors P1 and P2 are shown being formed on the opposite sides of N well 41 in FIG. 14, they are actually arranged on one side of N well 41 for each column, as shown in FIG. 15.

More specifically, in the configuration shown in FIG. 15, an N type impurity region 84 is formed on the outside of N well 41. N type regions 86a and 86b for forming pass transistors P1 and P2 are placed facing to N type impurity region 84. Transistor formation regions 86a and 86b are isolated from each other, and the substrate regions are biased to high voltage Va. When pass transistor P1 or P2 is conductive, voltage Va or Vb is supplied to N type impurity region 84. Transistor formation regions 86a and 86b may be aligned in the column direction, instead of the row direction.

N type region 84 is isolated for each memory cell column. An upper layer metal interconnection line (e.g., a fourth metal interconnection line) 87 is placed to be coupled to N type region 84 and to extend in the column direction. Upper layer metal interconnection line 87 is connected to N well 41 at appropriate intervals. The substrate voltage transmission line can be formed into a shunt structure, and the substrate voltage can be transmitted through a low resistance to back gates of the memory cells arranged in one column. In addition, the substrate voltage VPP can be changed at high speed.

As described above, according to the fourth embodiment of the present invention, P channel MOS transistor formation regions are formed separately and individually for the respective memory cell columns. Thus, it is possible to readily change the substrate potentials (back gate potentials) of the P channel MOS transistors (load PMOS transistors) of the memory cells in a selected column.

Fifth Embodiment

Figure 16:
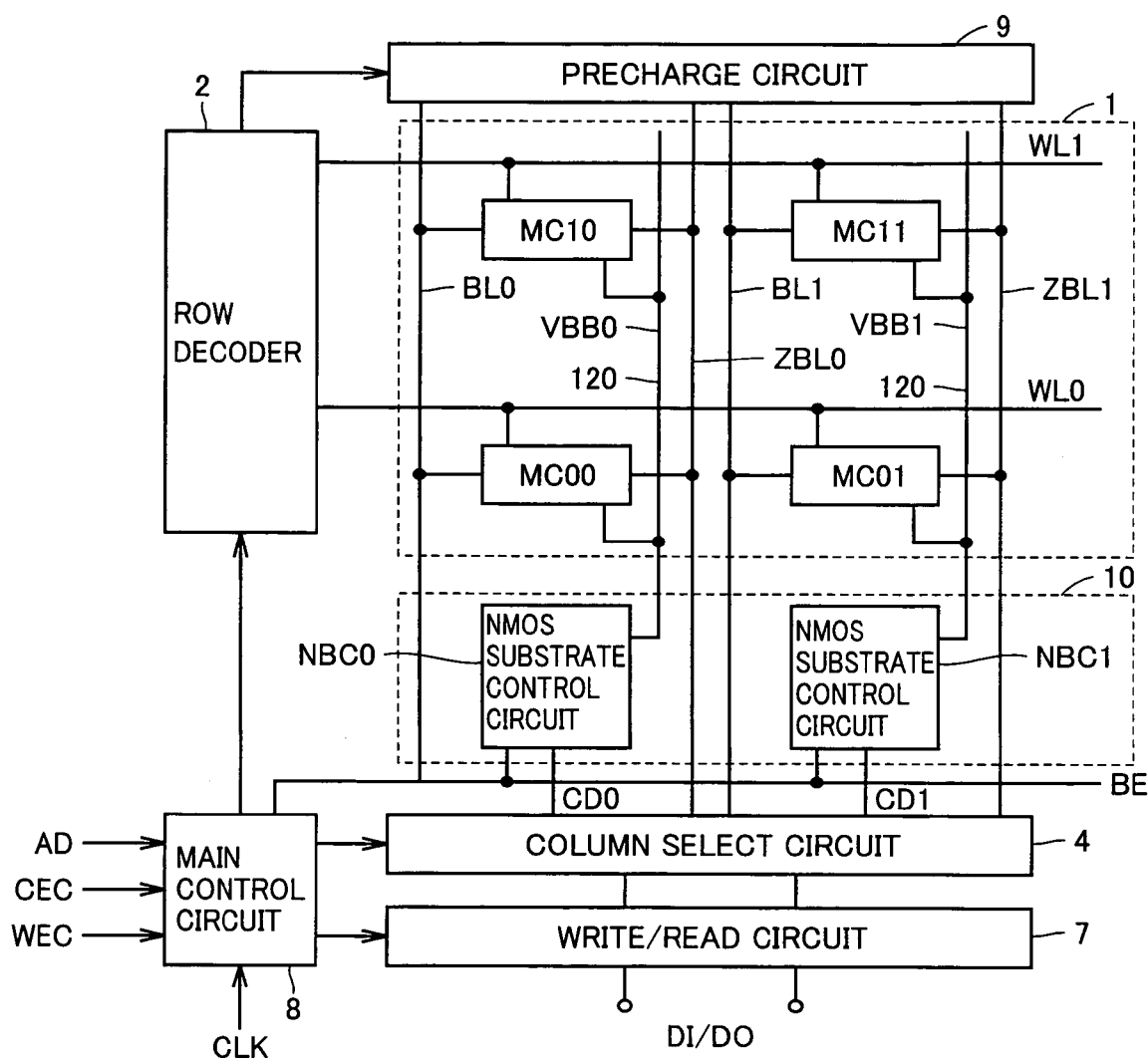
FIG. 16 schematically shows a configuration of a semiconductor memory device according to a fifth embodiment of the present invention.

FIG. 16 schematically shows an overall configuration of a semiconductor memory device according to a fifth embodiment of the present invention. In the configuration shown in FIG. 16, the substrate potential setting circuit 10 adjusts substrate potentials of N channel MOS transistors of memory cell MC in accordance with an operation mode. More specifically, substrate potential setting circuit 10 includes NMOS substrate control circuits NBC (NBC0, NBC1) arranged for the respective memory cell columns. NMOS substrate control circuit NBC supplies a voltage VBB to a substrate voltage transmission line 120 commonly arranged for the memory cells of a corresponding column. Voltage VBB on substrate voltage transmission line 120 is commonly provided to back gates of the NMOS transistors of the memory cells in the corresponding column. The other configuration of the semiconductor memory device shown in FIG. 16 is identical to that of the semiconductor memory device shown in FIG. 1, and the corresponding portions are denoted by the same reference characters and detailed description thereof is not repeated.

Figure 17:
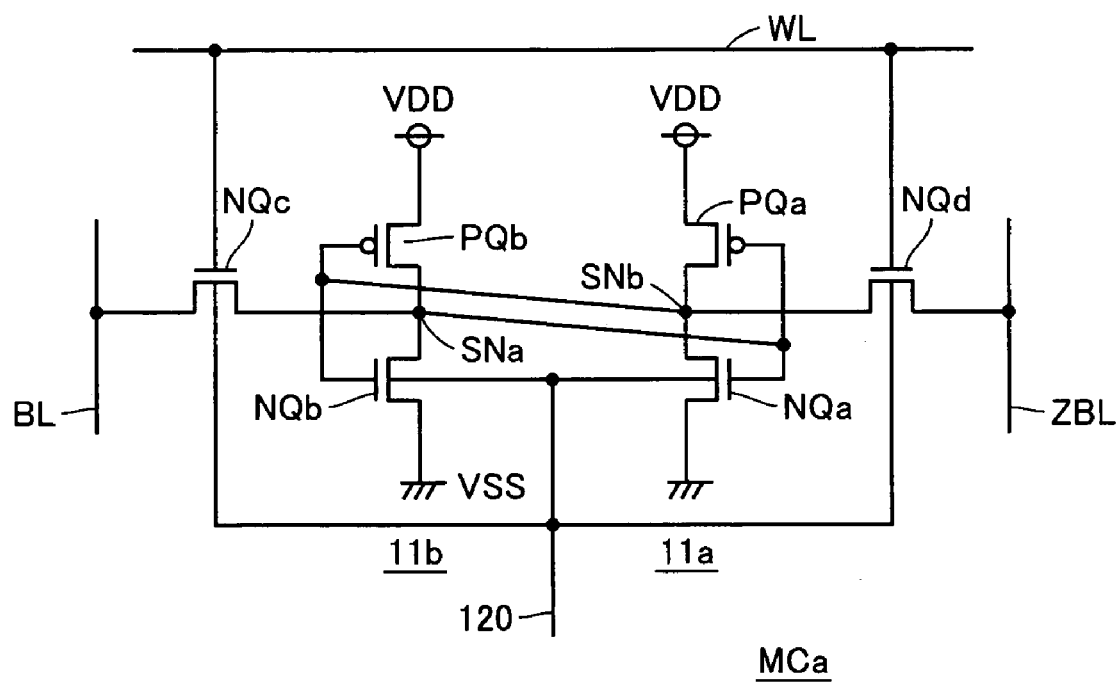
FIG. 17 schematically shows a configuration of the memory cell shown in FIG. 16.

FIG. 17 specifically shows a configuration of the memory cell MC shown in FIG. 16. As shown in FIG. 17, substrate voltage transmission line 120 is coupled to the substrate regions of N channel MOS transistors (access transistors) NQc and NQd, and also coupled to the substrate regions of N channel MOS transistors (drive transistors) NQa and NQb of inverters 11a and 11b. The substrate potentials of P channel MOS transistors (load PMOS transistors) PQa and PQb are fixed to power supply voltage VDD, for example. The other configuration of the memory cell MCa shown in FIG. 17 is identical to that of the memory cell shown in FIG. 2, and the corresponding portions are denoted by the same reference characters and detailed description thereof is not repeated.

Generally, when a substrate bias of an N channel MOS transistor becomes shallow, the threshold voltage decreases (becomes small), and the current driving capability increases. Thus, in data writing, the level of voltage VBB on substrate voltage transmission line 120 arranged for the selected column is increased to shallow the substrate bias for decreasing the threshold voltage of the N channel MOS transistors of the memory cells in the selected column, and the current driving capabilities (drain currents) of N channel MOS transistors NQa and NQb increase. In response, the static noise margin of the memory cell decreases, the data holding stability decreases, and data can be written at high speed. At this time, the substrate biases of accessing N channel MOS transistors NQc and NQd are also made shallow, and accordingly, the write data from bit lines BL and ZBL can be transferred to storage nodes SNa and SNb at high speed.

Figure 18:
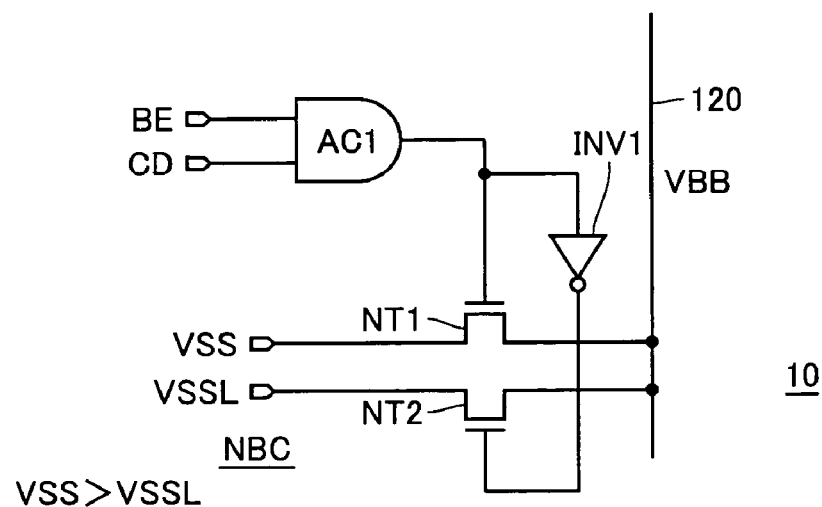
FIG. 18 shows by way of example a configuration of the substrate control circuit shown in FIG. 16.

FIG. 18 shows a configuration of the substrate control circuit NBC (representing NBC0, NBC1) shown in FIG. 16. In the configuration shown in FIG. 18, substrate voltage transmission line 120 extends in the column direction, and is commonly coupled to the substrate regions of the N channel MOS transistors of the memory cells arranged in one column.

NMOS substrate control circuit NBC includes an AND circuit AC1 receiving substrate control signal BE and column select signal CD, an inverter INV1 receiving an output signal of AND circuit AC1, an N channel MOS transistor (pass transistor) NT1 rendered conductive when an output signal of AND circuit NC1 is at an H level, to couple a voltage source VSS to substrate voltage transmission line 120, and an N channel MOS transistors NT2 rendered conductive when an output signal of inverter INVL is at an H level, to couple a voltage source VSSL to substrate voltage transmission line 120.

As an example, the voltage VSS is a ground voltage (0 V) and the voltage VSSL is −0.5 V. Voltage VSSL is set at a voltage level lower than voltage VSS Voltage VSSL is a negative voltage, and the PN junction between the substrate region and the impurity region in the N channel MOS transistor maintains an off state.

This low voltage (negative voltage) may be generated internally using a configuration similar to that of a negative voltage generating circuit that utilizes a charge pumping operation of a capacitor for generating a substrate bias voltage supplied to a substrate region of a memory cell array in a DRAM, or it may be externally supplied.

AND circuit AC1 and inverter INV1 have a level conversion function to convert a signal of a ground voltage VSS level to a negative voltage VSSL level. When negative voltage VSSL is transmitted to substrate voltage transmission line 120, pass transistor NT1 can be reliably maintained in an off state. When ground voltage VSS is transmitted to substrate voltage transmission line 120, pass transistor NT2 can be reliably set to an off state.

Figure 19:
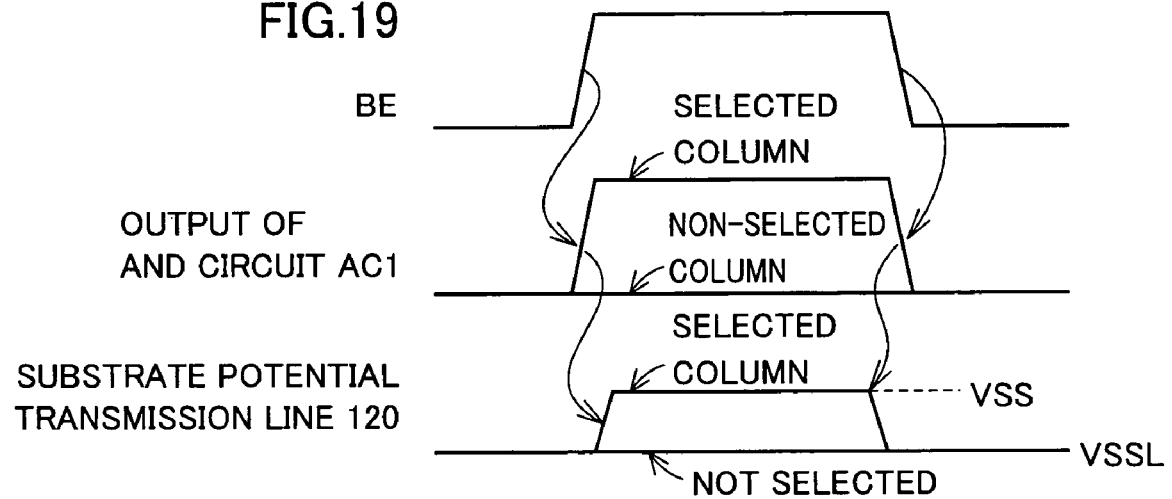
FIG. 19 is a signal waveform diagram representing an operation of the substrate control circuit shown in FIG. 18.

FIG. 19 is a signal waveform diagram representing an operation of NMOS substrate control circuit NBC shown in FIG. 18 in data writing. Now, the operation of the NMOS substrate control circuit NBC will be described briefly with reference to FIG. 19.

At the standby and at the time when data is not written, the output signal of AND circuit AC1 is at an L level. N channel MOS transistor NT2 is conductive, and low voltage source VSSL is coupled to substrate voltage transmission line 120. In this state, the substrate biases of the N channel MOS transistors of memory cell MC are deep, and accordingly, data can be held stably.

When a data write cycle starts, substrate control signal BE attains an H level. When column select signal CD attains an H level for a selected column, the output signal of AND circuit AC1 attains an H level, and in response, the output signal of inverter INV1 attains an L level. Thus, substrate voltage transmission line 120 is coupled to high voltage source VSS via N channel MOS transistor NT1, and the voltage level of substrate voltage transmission line 120 increases. The threshold voltages of the N channel MOS transistors of the memory cells in the selected column decrease, and thus, data can be written at high speed. In a non-selected column, the output signal of AND circuit AC1 is at an L level, the substrate bias voltage is voltage VSSL of the low voltage source, and thus, data can be held stably.

When the data writing is completed, substrate control signal BE becomes an L level, the output signal of AND circuit AC1 provided for the selected column falls again to an L level, and substrate voltage transmission line 120 is coupled to low voltage source VSS. Accordingly, the threshold voltages of the N channel MOS transistors of the memory cells in the selected column increase, which ensures stable holding of the written data.

Figure 20:
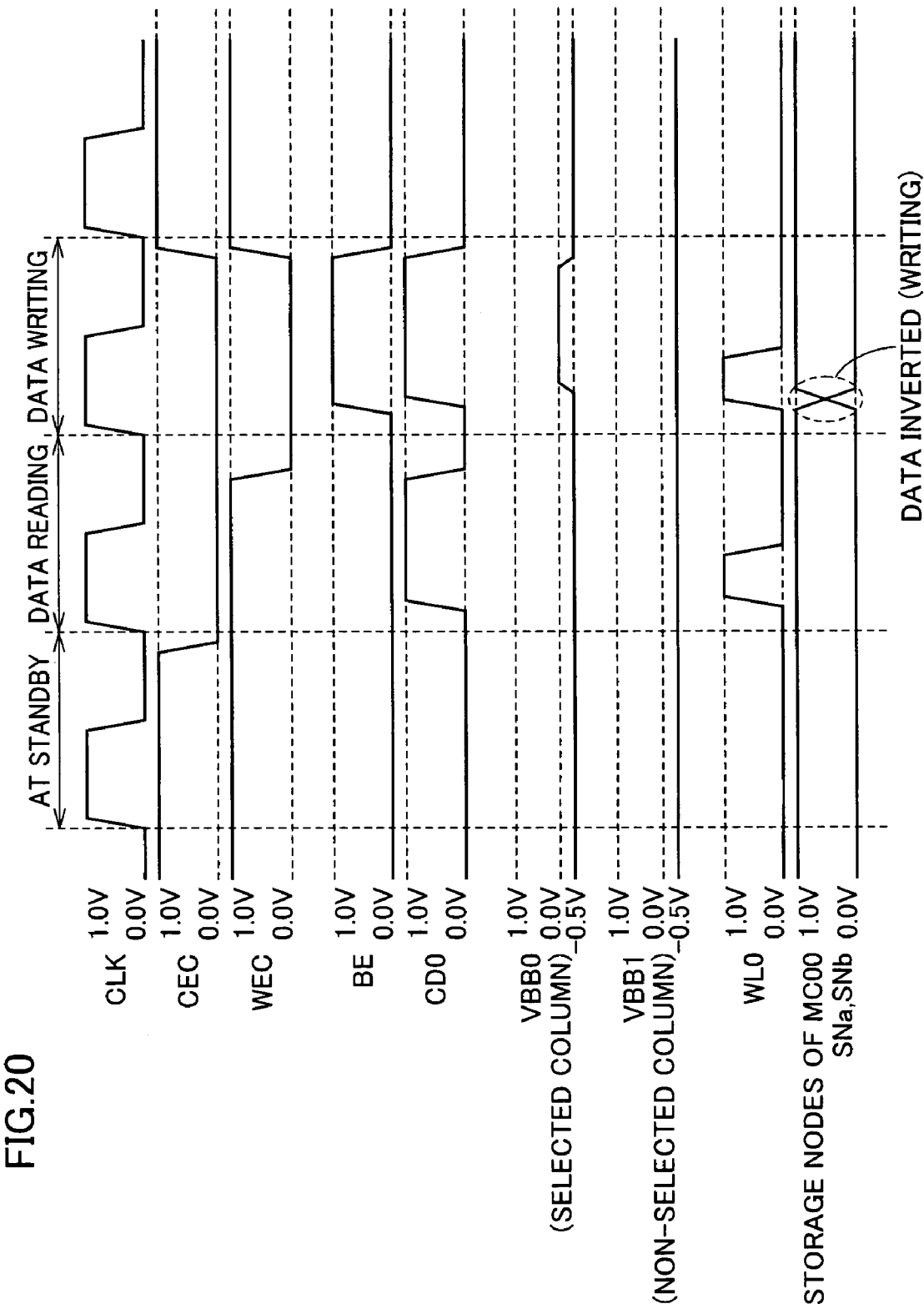
FIG. 20 is a timing chart representing an operation of the semiconductor memory device shown in FIG. 16.

FIG. 20 is a timing chart representing an operation of the semiconductor memory device according to the fifth embodiment of the present invention. Now, the operation of the semiconductor memory device shown in FIG. 16 is described with reference to FIG. 20. In FIG. 20, the amplitude of the internal signal is 1.0 V same as the power supply voltage VDD, and an H level on the internal signals corresponds to 1.0 V and an L level corresponds to VSS (0 V). Low voltage VSSL is −0.5 V.

When cell enable signal CEC is at an H level, the semiconductor memory device is in a non-selected state (standby state). Substrate control signal BE from main control circuit 8 is at an L level. Thus, the output signal of AND circuit AC1 shown in FIG. 18 is at an L level, and in response, the output signal of inverter INV1 is at an H level. Accordingly, pass transistor NT1 is in an off state and pass transistor P2 is in an on state, so that negative voltage VSSL from low voltage source VSSL is supplied as voltage VBB on substrate voltage transmission line 120. Responsively, N channel MOS transistors NQa–NQd shown in FIG. 17 each have the source and substrate (back gate) in a reverse bias state to have an increased threshold voltage. Thus, the static noise margin of each memory cell MC becomes large, and the data is held stably.

When an access cycle starts, cell enable signal CEC is set to an L level. When write enable signal WE is at an H level at the rising of the clock signal, a data read mode is designated. The data reading operation at this time is identical to that in the first embodiment shown in FIG. 4, except for the substrate voltage of the memory cell. Specifically, row decoder 2 and column select circuit 3 shown in FIG. 16 perform the decoding operation under the control of main control circuit 8, and select signals for the word line and the bit line pair corresponding to the row and column designated by the address signal AD rise to an H level. FIG. 20 shows the state where memory cell MC00 is designated. In this case, word line WL0 is driven to an H level by row decoder 2, and column select signal CD0 attains an H level. Storage nodes SNa and SNb of memory cell MC00 are connected to bit lines BL0 and ZBL0, and a potential difference occurs between bit lines BL0 and ZBL0. This potential difference is transmitted to write/read circuit 7 via column select circuit 4, and output data DO corresponding to the memory cell data is generated for data reading.

Selected word line WL0 is driven to a non-selected state after an elapse of a prescribed time period. When the sense operation of the memory cell data in write/read circuit 7 is completed, column select signal CD0 is also driven to a non-selected state.

In this data reading operation, voltage VBB of substrate voltage transmission line 120 is at a negative voltage VSSL level in each column, since substrate control signal BE is at an L level. In memory cell MC, the threshold voltages of the drive NMOS transistors are large, and the static noise margin is ensured sufficiently, so that data can be read stably.

A data writing operation is now described. It is assumed again that memory cell MC00 is selected. In data writing, cell enable signal CED and write enable signal WEC are both set to an L level. In response to rising of clock signal CLK, main control circuit 8 activates row decoder 2 and column select circuit 4. Word line WL0 and column select signal CD0 are both driven to an H level, as in the case of data reading operation.

In this data writing operation, main control circuit 8 drives substrate control signal BE to an H level. Thus, in NMOS substrate control circuit NBC0 provided for the selected column, the output signal of AND circuit AC1 shown in FIG. 18 attains an H level, and the output signal of inverter INV1 attains an L level. In response, voltage VSS from high voltage source VSS is transmitted to substrate voltage transmission line 120 via pass transistor NT1.

In memory cell MC00, N channel MOS transistors NQa–NQd shown in FIG. 17 have the substrate biases made shallow, the threshold voltages decreased and the current driving capabilities increased. The static noise margin of memory cell MC00 decreases, and thus, data can readily be inverted. Write/read circuit 7 writes data to bit lines BL0 and ZBL0 in the selected column, and the potentials of bit lines BL0 and ZBL0 change in accordance with the written data. At this time, the input logic threshold voltages of inverters 11a and 11b are both decreased and the static noise margin of the memory cell is decreased. Thus, it is possible to readily set the potentials of storage nodes SNa and SNb to the potential levels according to the written data. In the selected column, the current driving capabilities of access NMOS transistors NQc and NQd are also made large, so that the voltages of the bit lines can be transmitted to the storage nodes at high speed.

For memory cells MC01 and MC11 in a non-selected column, voltage VBB1 on substrate voltage transmission line 120 is negative voltage VSSL from low voltage source VSSL. The static noise margin is sufficiently large as in the data reading operation, and thus, data can be held stably. Accordingly, in the non-selected memory cell on the same row as the selected memory cell, even if the access transistors (NQc, NQd) enter an on state and the storage nodes are connected to corresponding bit lines BL and ZBL, data can be held stably.

In the memory cell in the same column as the selected memory cell, the access transistors (NQc, NQd) are in an off state, and storage nodes SNa and SNb are isolated from the corresponding bit lines BL and ZBL, and thus, their potentials do not change. Accordingly, even if the current driving capabilities of the drive NMOS transistors increase, it does not affect the data holding characteristics, and accordingly, data can be stored stably.

When the data writing is completed, the output signal of AND circuit AC1 attains an L level in response to falling of one of column select signal CD and substrate control signal BE. Negative voltage VSSL is transmitted again to substrate voltage transmission line 120 of the selected column via pass transistor NT2. Thus, the substrate biases of drive NMOS transistors NQa and NQb shown in FIG. 17 are deepened again, and the static noise margin increases. Accordingly, the written data can be held stably.

In data writing, the substrate biases of the N channel MOS transistors of each memory cell in a selected column are made shallow. The static noise margin of the memory cell decreases, and thus, it is possible to readily set the potentials of the storage nodes in accordance with the write data. In a memory cell on a non-selected column, the substrate potentials of the drive NMOS transistors are set to the negative voltage level the same as in the reading operation. Thus, the threshold voltages of the drive. NMOS transistors of the memory cell in the non-selected column are maintained at unchanged level, and the driving capabilities are also maintained. Thus, the static noise margin of the memory cell is ensured.

In data reading, the substrate bias is maintained in a deep state. Thus, the static noise margin of the memory cell is secured sufficiently, and thus, data can be read stably.

Accordingly, at the time of data writing, the substrate biases of the N channel MOS transistors of the memory cell in a selected column are made shallow to lower the threshold voltages and to increase the current driving capabilities. The static noise margin can thus be made small, and accordingly, it is possible to write data at high speed, while holding data stably, with the read and write margins sufficiently ensured.

In particular, in data writing, the substrate voltages of the N channel MOS transistors of the memory cells are adjusted in units of columns. Thus, compared to the case where the substrate voltages are adjusted in units of rows, the static noise margin of the memory cell in the selected row and in the non-selected column can be ensured sufficiently, and thus, data can be held stably even if the storage nodes of a non-selected memory cell are connected to the corresponding bit lines.

As described above, according to the fifth embodiment of the present invention, the substrate biases of the N channel MOS transistors of the memory cells are adjusted in units of columns, and in data writing, the substrate biases of the N channel MOS transistors in the selected column are made shallow. Accordingly, stable data holding and rapid data writing can both be realized.

Sixth Embodiment

Figure 21:
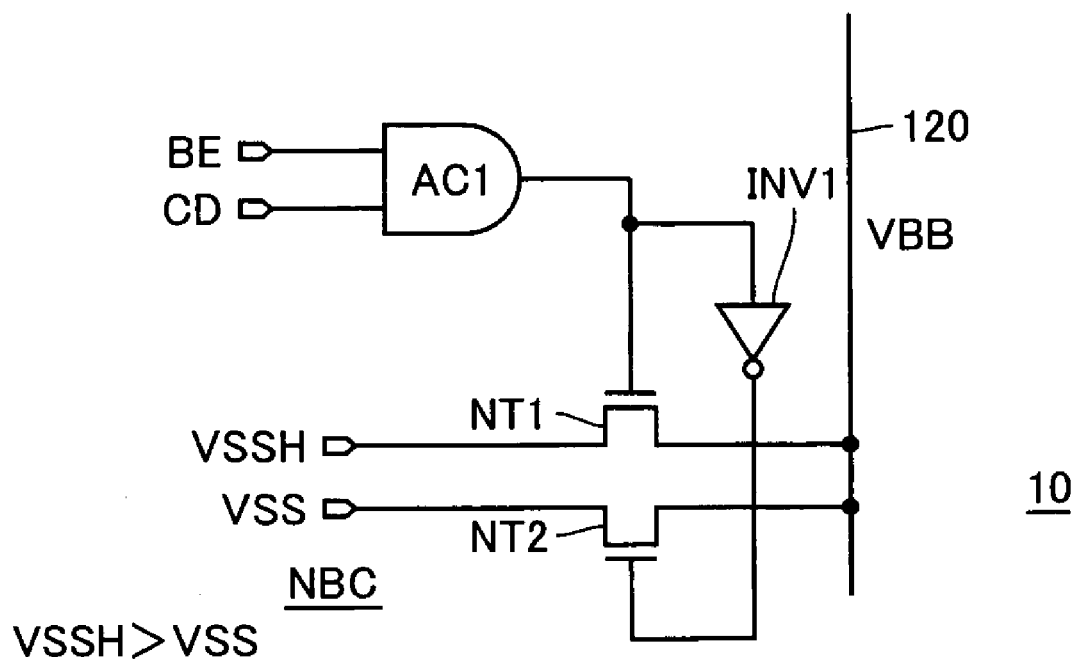
FIG. 21 shows a configuration of a substrate control circuit according to a sixth embodiment of the present invention.

FIG. 21 shows a configuration of an NMOS substrate control circuit NBC according to a sixth embodiment of the present invention. The configuration of the NMOS substrate control circuit NBC shown in FIG. 21 differs from that of the NMOS substrate control circuit shown in FIG. 18.in the following point. Specifically, a pass transistor NT1 is coupled to a high ground source supplying a high ground voltage VSSH and a pass transistor NT2 is coupled to a ground source. High ground voltage VSSH is higher than ground voltage VSS, and is set, e.g., to 0.5 V. Voltage VSSH is maintained at such a positive voltage level as to maintain the PN junction between the N type impurity region and the P type substrate region of the N channel MOS transistor in an off state. High ground voltage VSSH may be externally supplied, or may be generated from power supply voltage VDD, using a down-converting circuit such as a DC—DC converter, or a voltage-dividing circuit, or a constant voltage generating circuit that is formed of a constant current source and a resistance element.

The overall configuration of the semiconductor memory device of the present embodiment is identical to the configuration shown in FIG. 16. Now, an operation of the NMOS substrate control circuit NBC shown in FIG. 21 is described.

In the configuration of the substrate control circuit shown in FIG. 21, substrate control signal BE is at an L level and the output signal of AND circuit AC1 is at an L level in a standby state, in the non-selected state, and in data reading. Thus, pass transistor NT2 is conductive, pass transistor NT1 is non-conductive, and ground voltage VSS is transmitted to substrate voltage transmission line 120 as substrate bias voltage VBB.

In data writing, the output signal of AND circuit AC1 for the selected column attains an H level, pass transistor NT1 is turned on, and voltage VBB on substrate voltage transmission line 120 turns high ground voltage VSSH. In response, the threshold voltages of the N channel MOS transistors in the selected memory cell decrease, the static noise margin decreases, and thus, data can be written stably at high speed.

In a non-selected column, substrate bias voltage VBB is at a ground voltage VSS level, as in the standby state and in the data reading operation, and thus, data is held stably.

In the case of the configuration of NMOS substrate control circuit NBC shown in FIG. 21, the amplitude of the output signal of AND circuit AC1 corresponds to power supply voltage VDD, and therefore, the gate-source voltage of each pass transistor is at most the power supply voltage VDD. Thus, reliability of the pass transistors can be ensured by utilizing the transistors the same as the memory cell transistors in the NMOS substrate control circuit.

Figure 22:
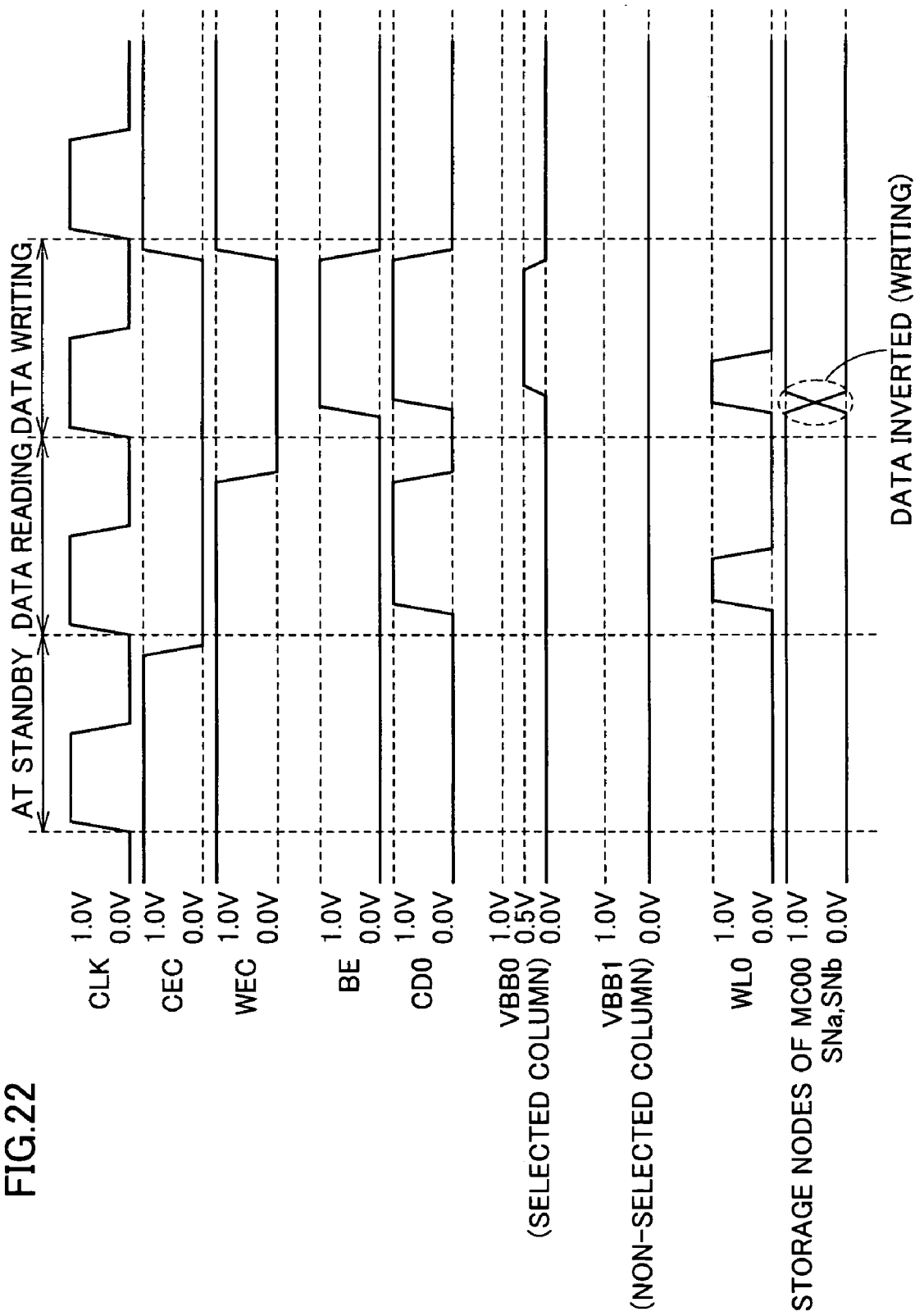
FIG. 22 is a timing chart representing an operation of the semiconductor memory device according to the sixth embodiment of the present invention.

FIG. 22 is a timing chart representing an overall operation when NMOS substrate control circuit NBC shown in FIG. 21 is employed. The operation shown in the timing chart of FIG. 22 is substantially the same as the operation shown in the timing chart of FIG. 20, except for the voltage level of the NMOS substrate bias voltage VBB. In data writing, substrate bias voltage VBB of the NMOS transistors in the selected column is set to a ground voltage VSS (0 V) level, and the NMOS substrate bias voltage VBB of the memory cells in a non-selected column is maintained at a high ground voltage (0.5 V) level.

In the standby state and in data reading, NMOS substrate bias voltage VBB is maintained at ground voltage VSS for each memory cell.

When high ground voltage VSSH and ground voltage VSS are employed and the NMOS substrate bias voltage VBB only in a selected column is set to high ground voltage VSSH in data writing as shown in the present embodiment, the static noise margin for a data write cell can be reduced, and rapid data writing and stable data reading are ensured.

As described above, according to the sixth embodiment of the present invention, the voltage transmitted to the substrate voltage transmission line of a selected column is set to a high ground voltage higher than the ground voltage, and thus, data can be read stably or written at high speed. Further, the voltage applied to the pass transistors of the substrate control circuit can be restricted to a level not higher than the power supply voltage, and thus, element reliability is ensured and a substrate control circuit operating stably is implemented.

It is noted that in the NMOS substrate control circuit, a configuration that one-shot-drives substrate voltage transmission line 120 to a ground voltage for a prescribed time period upon completion of data writing may be employed in combination. In this case, substrate voltage VBB of the selected column can be set to the original ground voltage level at high speed, and accurate data writing and reading are ensured even when a high-speed clock signal is employed.

Seventh Embodiment

Figure 23:
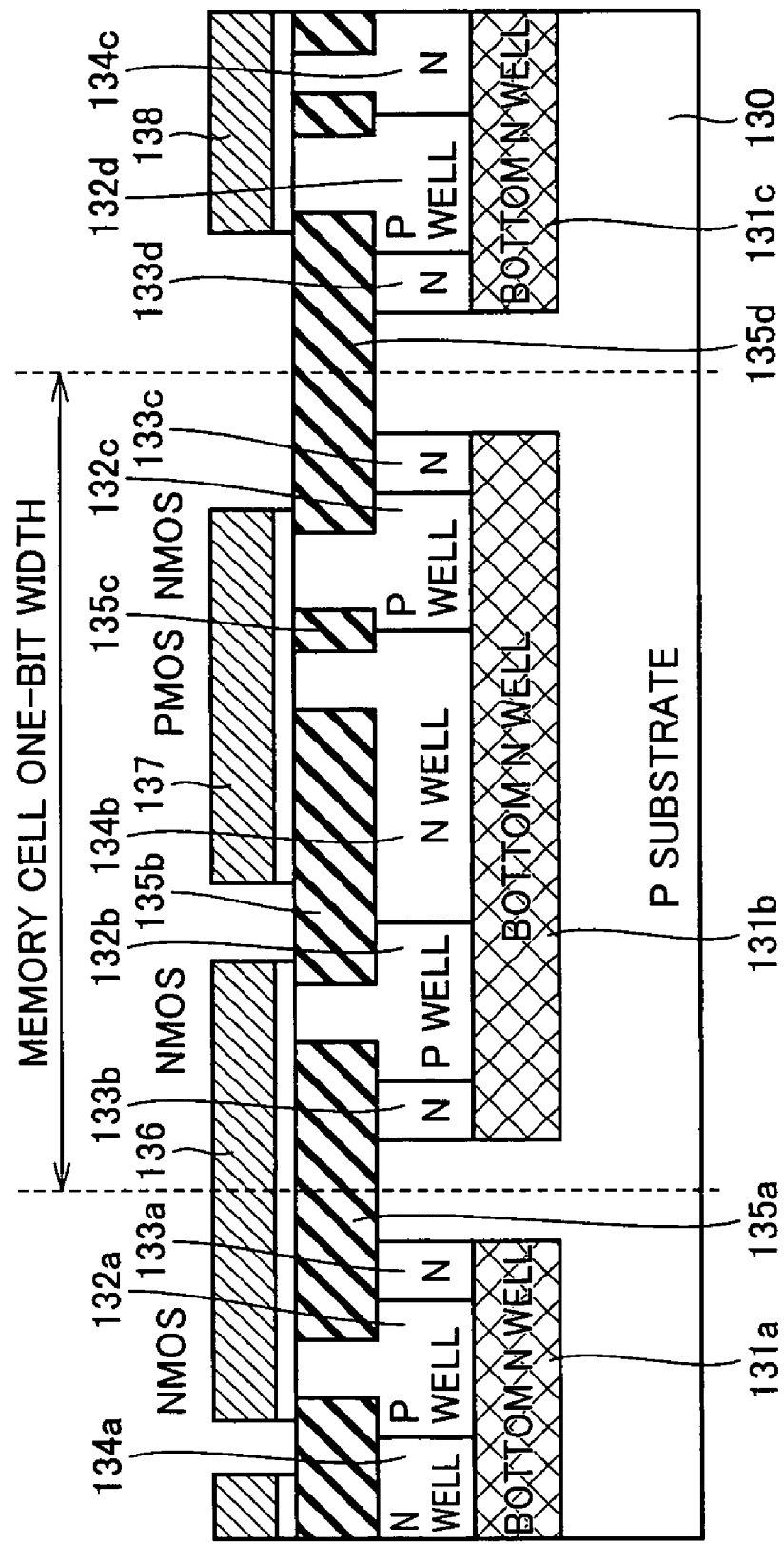
FIG. 23 schematically shows a cross-sectional structure of a memory cell according to a seventh embodiment of the present invention.

FIG. 23 schematically shows a cross sectional structure of memory cells according to a seventh embodiment of the present invention. The planar layout of the memory cells shown in FIG. 23 is the same as that of the memory cells shown in FIG. 9. However, in order to adjust the substrate biases of N channel MOS transistors of the memory cells in units of columns, the P wells for forming the N channel MOS transistors are isolated every column. On a P substrate 130, bottom N wells 131a, 131b and 131c are formed for each memory cell column. Bottom N wells 131a–131c are isolated from each other.

An N well 134a, a P well 132a and an N well 133a are formed on bottom N well 131a. A P channel MOS transistor of a memory cell is formed in N well 134a, and an N channel MOS transistor is formed in P well 132a. N well 133a is a dummy well region, which is provided for isolating the substrate regions of the NMOS transistors in units of columns.

An N well 133b, a P well 132b, an N well 134b, a P well 132c, and an N well 133c are formed on bottom N well 131b. N wells 133b and 133c are dummy well regions for isolation of the memory cell columns. N channel MOS transistors of the memory cell are formed in P wells 132b and 132c, and a P channel MOS transistor of the memory cell is formed in N well 134b.

P wells 132a and 132b are isolated from each other by an element isolation region 135a. Thus, even when gate electrodes 136 of the access transistors in the adjacent columns are commonly placed, the substrate regions of the access transistors are isolated from each other, and also isolated from P substrate 130. The MOS transistors formed in P wells 132b and 134b are isolated by an element isolation region 135b, and the MOS transistors formed in N well 134b and P well 132c are isolated by an element isolation region 135c.

Thus, even if gate electrodes 137 of the MOS transistors constituting the inverters of the memory cell are commonly placed, the P channel and N channel MOS transistors can be separated reliably.

An N well 133d, a P well 132d, and an N well 134c are formed on bottom N well 131c. N well 133d is a well region for isolating the columns. An N channel MOS transistor is formed in P well 132d, and a P channel MOS transistor is formed in N well 134c. A gate electrode 138 is formed on P wells 132d and N well 134c. The N channel MOS transistors formed in P wells 132c and 132d are isolated by an element isolation region 135d.

Element isolation regions 135a–135d each have a trench isolation structure. Bottom N wells 131a–131c are biased to prescribed voltages by the correspondingly provided N wells, and reliably separate the memory cell formation regions from P substrate 130 for the respective isolated cell columns.

By the use of dummy N wells 133a–133d to isolate the substrate regions for formation of memory cells in units of columns, as shown in FIG. 23, the bias voltages of the P wells for formation of the N channel MOS transistors can be adjusted in units of columns.

For applying a substrate bias voltage to a P well, a configuration identical to that of FIG. 14 or FIG. 15 can be employed. With the conductivity types simply reversed, N channel MOS transistors which transmit a high voltage (ground voltage or high ground voltage) and a low voltage (negative voltage or ground voltage), respectively, are formed in P wells isolated by bottom N wells in the lower portion of the P well regions. In this case, pass transistors NT1 and NT2 may be formed in a common P well, with the common P well coupled to the low voltage source.

As described above, according to the seventh embodiment of the present invention, a lateral cell structure is employed for the layout of the memory cells, where P and N wells are arranged extending in the column direction for each column with the wells isolated from the wells for other columns. Thus, it is possible to readily change the threshold voltages of the N channel MOS transistors in units of columns. Accordingly, data can be written at high speed without impairing the data holding characteristics.

Eighth Embodiment

Figure 24:
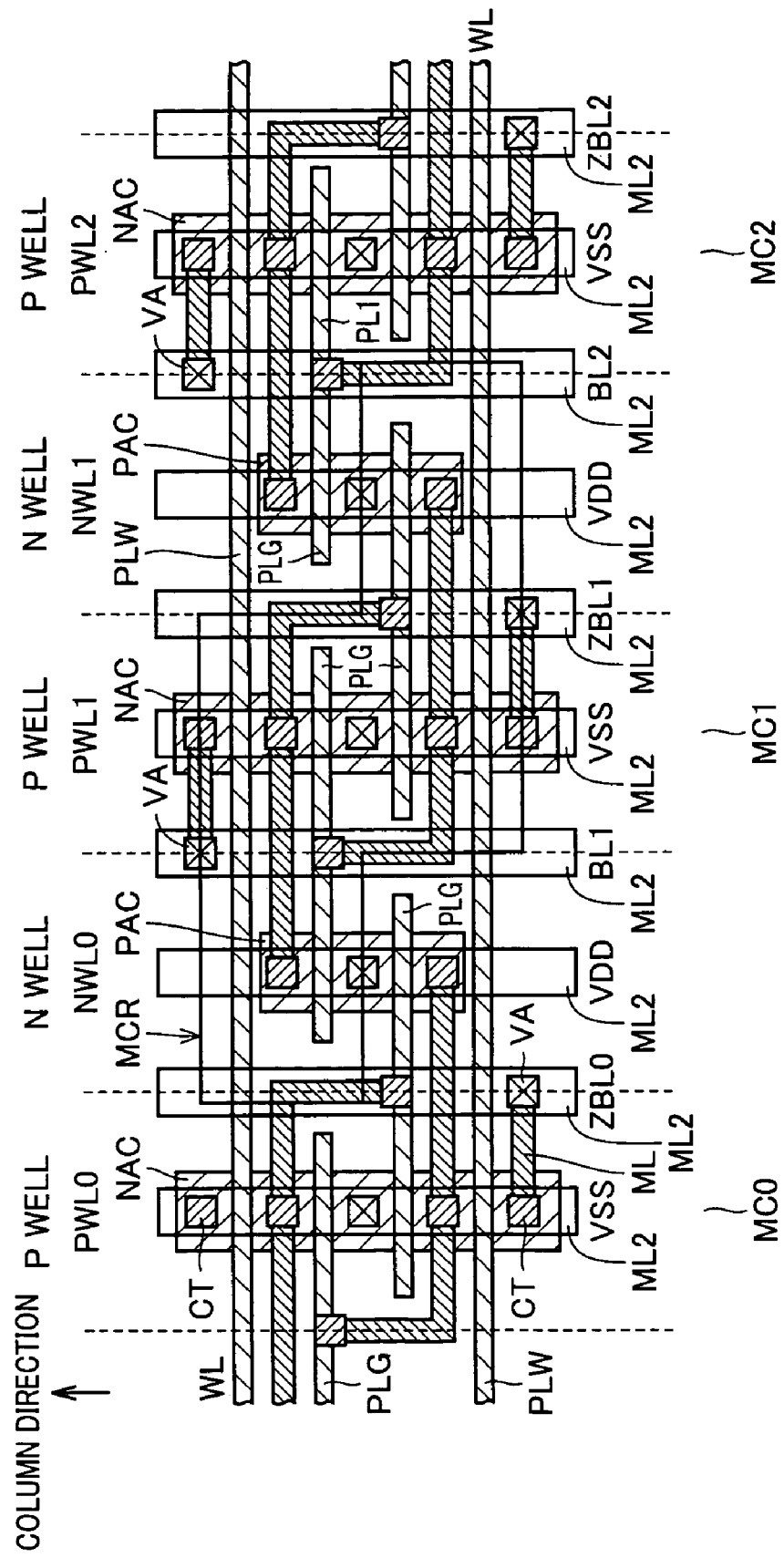
FIG. 24 schematically shows layout of memory cells according to an eighth embodiment of the present invention.

FIG. 24 schematically shows planar layout of a memory cell array according to an eighth embodiment of the present invention. In FIG. 24, the layout of memory cells MC0–MC3 arranged in three columns is schematically shown.

Referring to FIG. 24, P wells PWL and N wells NWL are arranged alternately in the row direction and extending linearly in the column direction. In FIG. 24, P wells PWL0–PWL2 and N wells NWL0 and NWL1 are arranged alternately. In each of P wells PWL0–PWL2, an N type active region NAC for forming N channel MOS transistors is formed in a rectangular shape in the column direction. In each of N wells NWL0 and NWL1, a P type active region PAC for forming P channel MOS transistors is formed in a rectangular shape. In N type active region NAC, four N channel MOS transistors are formed. In P type active region PAC, two P channel MOS transistors are formed.

P type active region PAC is formed by doping P type impurity with a first polysilicon interconnection line PLG used as a mask. N type active region NAC is formed by doping P type impurity with first polysilicon interconnection lines PLG and PLW used as masks.

First polysilicon interconnection line PLW arranged continuously extending in the row direction constitutes a word line. First polysilicon interconnection line PLG. constitutes a gate electrode of a memory cell transistor. In N type active region NAC, four N channel MOS transistors of one-bit memory cell are formed. In P type active region PAC, load PMOS transistors of the adjacent memory cells are formed.

Thus, one-bit memory cell formation region MCR is formed of two rectangular regions each including one P channel MOS transistor and two N channel MOS transistors formed in the adjacent N well NWL and P well PWL. These two memory cell rectangular regions include the regions arranged in the same P well and the regions arranged in the different N wells.

P type active region PAC is connected to the N type active region of the same memory cell via a contact CT, through a first metal interconnection line ML1 extending in the row direction. Thus, the-drain regions of the access and drive transistors and the drain of the load PMOS transistor are interconnected.

First polysilicon interconnection line PLG is formed, in parallel with first metal interconnection line ML1, traversing P type active region PAC and N type active region NAC in the same memory cell region MCR. First polysilicon interconnection line PLG forms gate electrodes of the MOS transistors constituting the CMOS inverter of the memory cell. First polysilicon interconnection line PLG is connected via a contact CT to a first metal interconnection line ML1 extending in the column direction in memory cell region MCR, and cross-connection of the input and output of the CMOS inverter pair is formed.

Second metal interconnection lines ML2 are arranged extending linearly in the column direction, corresponding to well center portions and well boundary regions. Second metal interconnection lines ML2 form a bit line, a ground line transmitting ground voltage VSS, and a power supply line transmitting power supply voltage VDD in this order. Second metal interconnection lines ML2 constituting the power supply line and the ground line are arranged in alignment with N type and P type active regions NAC and PAC, respectively, and supply ground voltage VSS and power supply voltage VDD to the memory cells. Second metal interconnection line ML2 constituting the ground line is connected to the N type active region formed below through a first via VA and a contact CT. Second metal interconnection line ML2 constituting the power supply line is connected to P type active region PAC formed below through a first via VA and a contact.

Bit lines BL and ZBL are arranged alternately between the ground line and the power supply line. In FIG. 24, second metal interconnection line ML2 constituting bit line ZBL0 is arranged in a region between P well PWL0 and N well NWL0. Second metal interconnection line ML2 constituting bit line BL1 is arranged in a region between N well NWL0 and P well PWL1. Second metal interconnection line ML2 constituting bit line ZBL1 is arranged in the boundary region between wells PWL1 and NWL1, and second metal interconnection line ML2 constituting bit line BL2 is arranged in the boundary region between wells NWL1 and PWL2. Second metal interconnection line ML2 constituting bit line ZBL2 is arranged in a boundary region between P well PWL2 and an N well not shown. Second metal interconnection lines ML2 constituting the bit lines are each connected to the adjacent N type active region through first via VA and a contact.

Accordingly, in the layout of the memory cells shown in FIG. 24, second metal interconnection lines ML2 transmitting power supply voltage VDD and ground voltage VSS are arranged extending in the column direction, and N type active region NAC for forming the N channel MOS transistors is arranged in the P well region extending in the column direction. Thus, P wells PWL for the respective memory cell columns are arranged isolatedly.

The layout shown in FIG. 24 is formed on an N type semiconductor substrate. Alternatively, the layout shown in FIG. 24 may be formed on a P type semiconductor substrate. In such case, a triple-well structure as shown in FIG. 23 is employed, and a bottom N well is formed in the lower portions of P well PWL and N well NWL to electrically separate the P well PWL from the P type semiconductor substrate. According to such arrangement, the voltages of the P wells constituting the back gates of the N channel MOS transistors of the memory cells can be set in units of memory cell columns. In this case, N well NWL between P wells PWL is fixed to power supply voltage VDD, and thus, it is not particularly necessary to isolate the bottom N wells for the respective columns.

Figure 25:
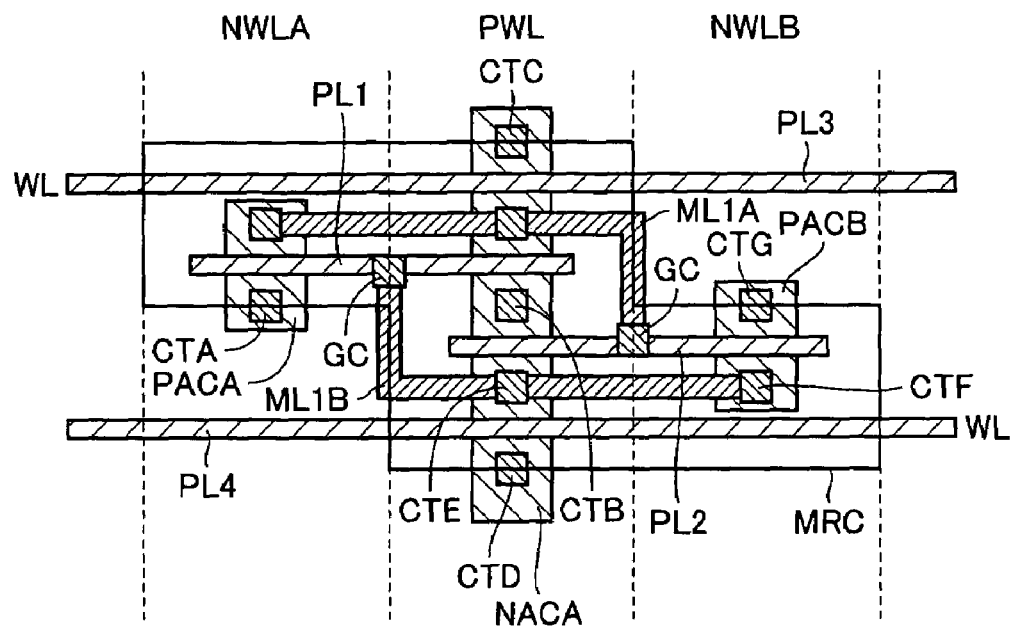
FIG. 25 shows layout of a portion of the one-bit memory cell in the layout shown in FIG. 24.

FIG. 25 shows the layout of one-bit memory cell in more detail. In FIG. 25, the one-bit memory cell formation region MRC includes an N type active region NACA for forming N channel MOS transistors, and P type active regions PACA and PACB for forming P channel MOS transistors. N type active region NACA is formed in P well PWL, and P type active regions PACA and PACB are formed in N wells NWLA and NWLB, respectively.

First polysilicon interconnection lines PL3 and PL4 are arranged, traversing the wells in the row direction to form word lines WL. Polysilicon interconnection lines PL3 and PL4 transmit the same word line driving signal.

In one-bit memory cell formation region MRC, a first polysilicon interconnection line PL1 is arranged traversing active regions PACA and NACA. First polysilicon interconnection line PL1 is connected to a first metal interconnection line ML1B via a gate contact GC in the well boundary region. First metal interconnection line ML1B is formed in an L shape, and coupled to active regions NACA and PACB via contacts CTE and CTF, respectively.

A first polysilicon interconnection line PL2 is arranged traversing active regions NACA and PACB. First polysilicon interconnection line PL2 is connected to a first metal interconnection line ML1A arranged in a shape symmetrical to first metal interconnection line ML1B. First metal interconnection line ML1A is connected to active regions NACA and PACA via contacts.

The second metal interconnection lines extending linearly in the column direction are arranged in the upper layer, although not shown in FIG. 25. N type active region NACA is connected to the second metal interconnection lines constituting bit lines BL and ZBL via contacts CTC and CTD, respectively, and also connected to the second metal interconnection line constituting the ground line transmitting the ground voltage via a contact CTB formed at the center thereof P type active region PACA is connected to the second metal interconnection line constituting the power supply line transmitting the power supply voltage via a contact CTA. P type active region PACB is connected to the second metal interconnection line constituting another power supply line via a contact CTG.

The memory cell transistors can be arranged in alignment in the column direction. Connection of the storage nodes can be implemented with the internal first metal interconnection lines, and thus, there is no overlapping in interconnection and interconnection lines can be arranged efficiently. Further, the first polysilicon interconnection lines constituting the gates of the transistors are arranged only in the row direction, which facilitates control of the gate widths of the transistors.

Figure 26:
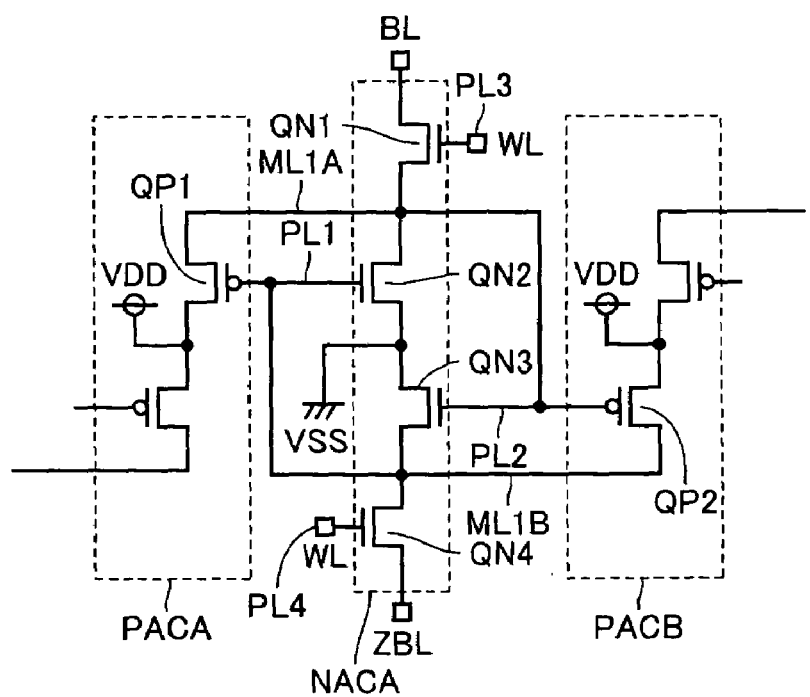
FIG. 26 shows an electrically equivalent circuit of the layout shown in FIG. 25.

FIG. 26 shows an electrically equivalent circuit of the layout shown in FIG. 25. Referring to FIG. 26, a P channel MOS transistor QP1 is arranged in P type active region PACA, and receives power supply voltage VDD at its source.

N channel MOS transistors QN1–QN4 are formed in N type active region NACA. MOS transistor QN1 has its gate coupled to word line WL formed of first polysilicon interconnection line PL3, its one conduction node connected to bit line BL, and another conduction node connected to first metal interconnection line ML1A.

MOS transistor QN2 is connected between MOS transistor QN1 and a ground line, and has its gate connected to first metal interconnection ML1B.

MOS transistor QN3 is connected between the ground line and MOS transistor QN4, and has its gate connected to first metal interconnection line ML1A.

MOS transistor QN4 is connected to bit line ZBL, and has its gate connected to word line WL formed of first polysilicon interconnection line PL4.

A P channel MOS transistor QP2 is formed in P type active region PACB. MOS transistor QP2 has its source connected to a power supply line to receive power supply voltage VDD, and has its drain connected to first metal interconnection line ML1B.

The gates of MOS transistors QP1 and QN2 constituting one CMOS inverter of the memory cell are connected to first polysilicon interconnection line PL1, and the gates of MOS transistors QN3 and QP2 constituting another CMOS inverter are connected to first polysilicon interconnection line PL2.

In this configuration, N channel MOS transistors QN1–QN4 are arranged in alignment in the column direction. The P well for forming the N type active region is isolated from the P well in the adjacent column by the N well. P well PWL is supplied with the bias voltage VBB for each column, separately from ground voltage VSS.

Figure 27:
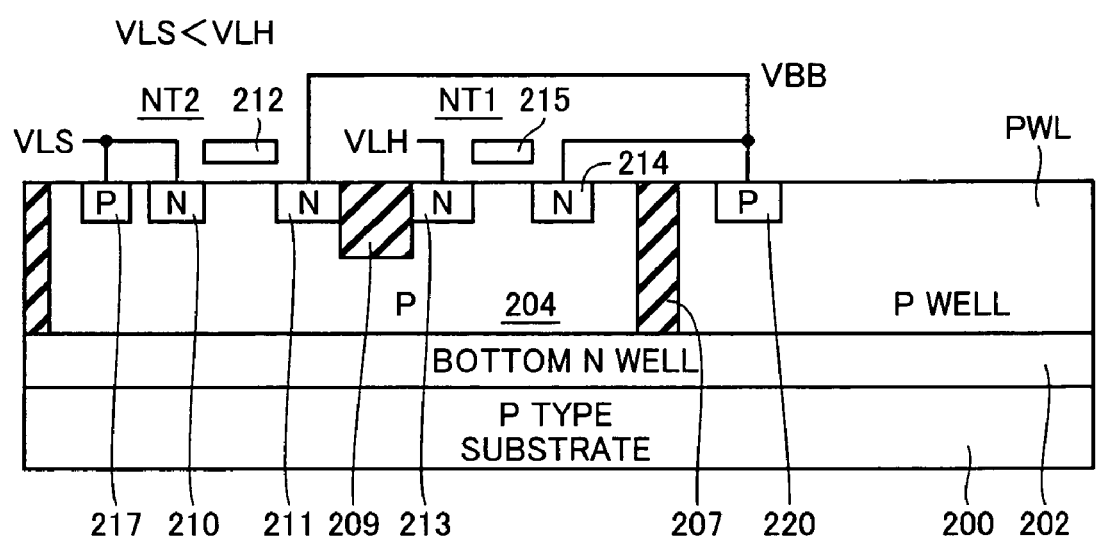
FIG. 27 schematically shows a configuration of a portion supplying a substrate bias voltage to the layout shown in FIG. 24.

FIG. 27 schematically shows structures of pass transistors NT1 and NT2 in the NMOS substrate control circuit NBC. In FIG. 27, a bottom N well 202 is formed on a P type substrate 200 to isolate the P wells.

P well PWL for forming the memory cell transistors and a P well 204 for forming pass transistors NT1 and NT2 are formed on bottom N well 202. P wells PWL and 204 are fully isolated by an element isolation film 207 reaching bottom N well 202.

Pass transistor NT2 has N type impurity regions 210 and 211 formed spaced apart from each other on P well 204, and a gate electrode 212 formed above the well region between impurity regions 210 and 212 with an insulating film, not shown, interposed therebetween. A low ground voltage VLS is applied to impurity region 210. P well 204 is biased to low bias voltage VLS (ground voltage or negative voltage) by a P type impurity region 217 formed at the surface thereof.

Pass transistor NT1 has N type impurity regions 213 and 214 formed spaced apart from each other on P well 204, and a gate electrode 215 formed above the well region between impurity regions 213 and 214 with an insulating film, not shown, interposed therebetween. A high bias voltage VLH (positive voltage or ground voltage) is applied to impurity region 213.

Pass transistors NT1 and NT2 are isolated by a partial element isolation film 209 formed in P well 204. Impurity regions 211 and 214 are commonly coupled to a P type impurity region 220 formed at the surface of P well PWL. When pass transistor NT1 or NT2 is conductive, bias voltage VBB is supplied to P well PWL via P type impurity region 220.

When pass transistor NT2 is conductive and low bias voltage VLS is selected, low bias voltage VLS is supplied to P well PWL via impurity regions 211 and 220. In this condition, even if low bias voltage VLS is transmitted to impurity region 214, the PN junction between impurity region 214 and P well 204 maintains a non-conductive state, since pass transistor NT1 is in an off state and P well 204 is biased to low bias voltage VLS.

Further, even if high bias voltage VSH is constantly applied to impurity region 213, the PN junction between impurity region 213 and P well 204 maintains a non-conductive state, since P well 204 is biased to low bias voltage VLS.

By arranging the structure shown in FIG. 27 for each P well PWL, the substrate voltages of the N channel MOS transistors can be controlled in units of memory cell columns.

P well 204 may be provided commonly for the NMOS substrate control circuits.

Further, as in the configuration shown in FIG. 15, a shunt interconnection line may be arranged in parallel with the ground line to transmit substrate bias voltage VBB. According to the shunt structure, the substrate bias voltage VBB can be changed at high speed.

As described above, according to the eighth embodiment of the present invention, the wells are arranged in the column direction, and the P and N wells are arranged alternately in the row direction. Accordingly, it is possible to readily set the substrate bias voltages of the N channel MOS transistors in units of memory cell columns.

Ninth Embodiment

Figure 28:
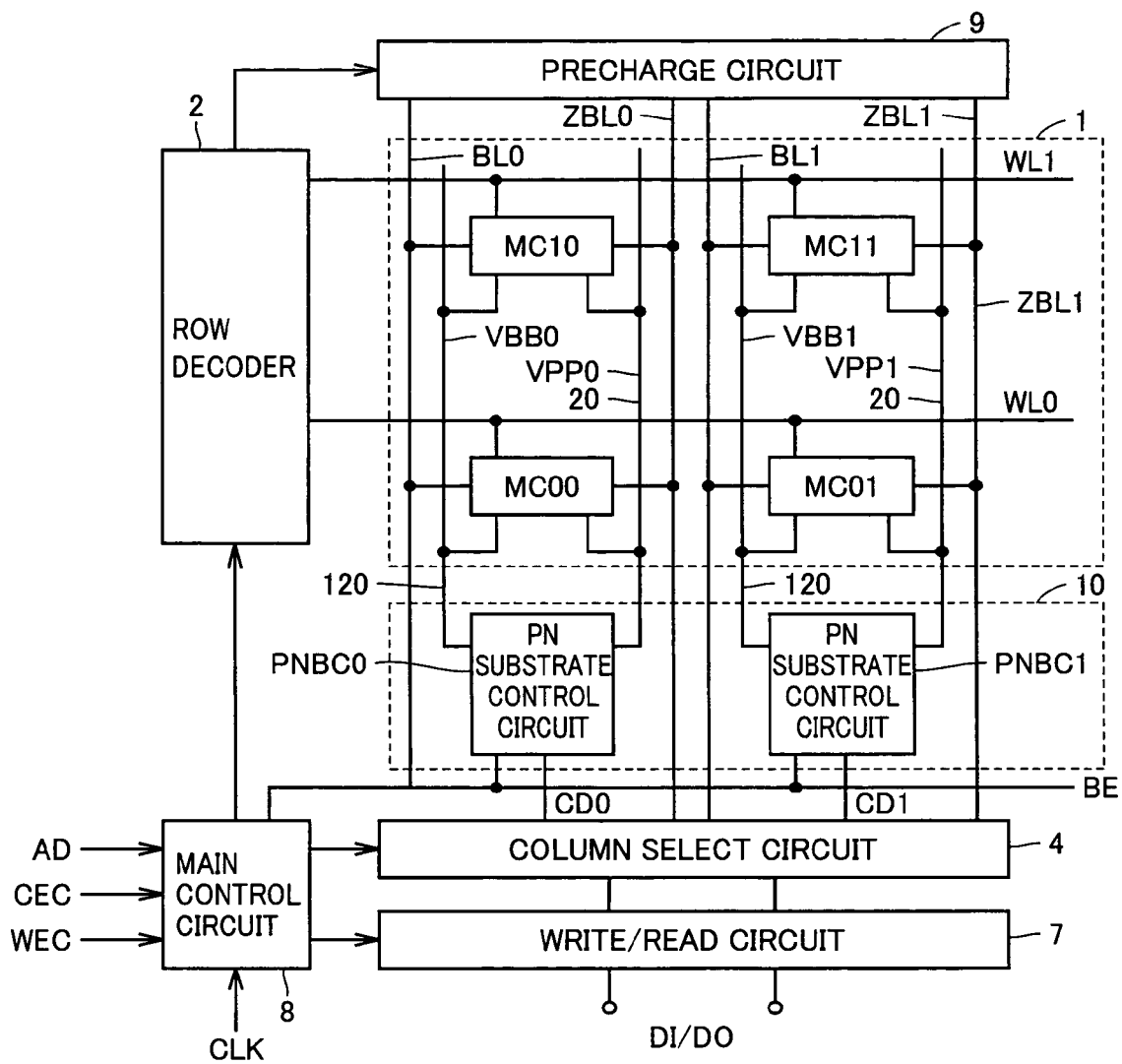
FIG. 28 schematically shows an overall configuration of a semiconductor memory device according to a ninth embodiment of the present invention.

FIG. 28 shows an overall configuration of a semiconductor memory device according to a ninth embodiment of the present invention. The semiconductor memory device shown in FIG. 28 differs from the semiconductor memory device shown in FIG. 1 in the following points. Specifically, substrate potential setting circuit 10 includes PN substrate control circuits PNBC which control the substrate voltages of the P channel and N channel MOS transistors of the memory cells in accordance with an operation mode. In FIG. 28, a PN substrate control circuit PNBC0 arranged corresponding to bit lines BL0 and ZBL0 and a PN substrate control circuit PNBC1 arranged corresponding to bit lines BL1 and ZBL1 are shown.

Each PN substrate control circuit PNBC drives a substrate voltage transmission line 20 transmitting a substrate voltage VPP of the P channel MOS transistors of the memory cells in the corresponding column and also drives a substrate voltage transmission line 120 transmitting a substrate bias voltage VBB of the N channel MOS transistors of the memory cells in the corresponding column.

The other configuration of the semiconductor memory device shown in FIG. 28 is identical to that of the semiconductor memory device shown in FIG. 1, and the corresponding portions are denoted by the same reference characters and detailed description thereof is not repeated.

Figure 29:
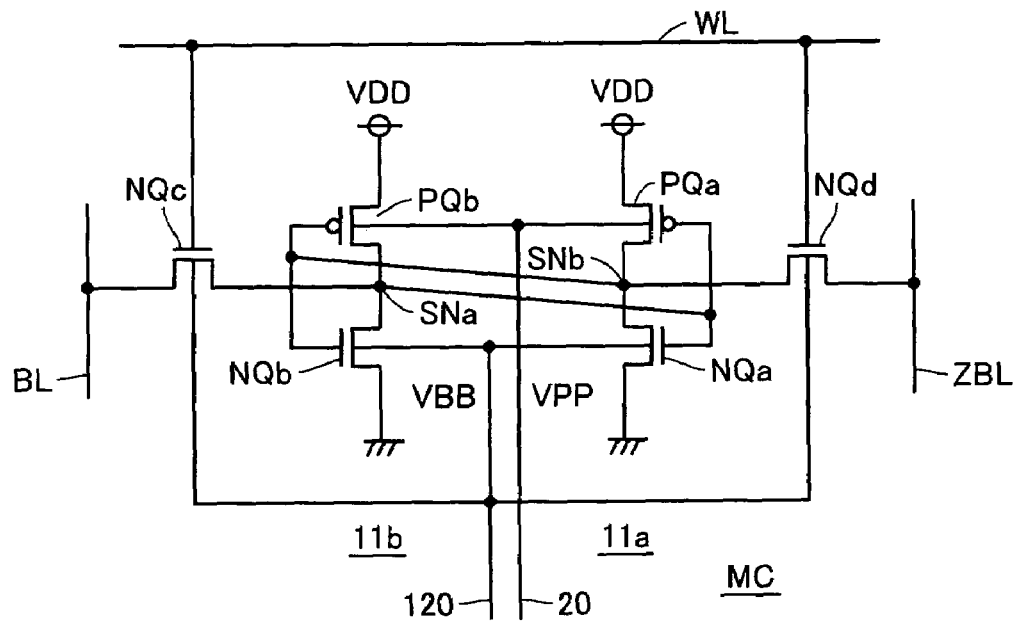
FIG. 29 schematically shows a configuration of the memory cell of the semiconductor memory device shown in FIG. 28.

FIG. 29 specifically shows the configuration of memory cell MC. The configuration of memory cell MC is same as shown in the preceding embodiments. Inverter 11a includes P channel MOS transistor (load PMOS transistor) PQa and N channel MOS transistor (drive NMOS transistor) NQa, and inverter 11b includes P channel MOS transistor PQb and N channel MOS transistor NQb. Memory cell MC further includes access NMOS transistors NQc and NQd for connecting the internal storage nodes SNa and SNb to bit lines BL and ZBL in accordance with a signal on word line WL.

The substrate regions (back gates) of load PMOS transistors PQa and PQb are coupled to substrate voltage transmission line 20. Substrate voltage transmission line 120 is coupled to the substrate regions of N channel MOS transistors NQa, NQb, NQc and NQd.

The substrate control circuit PNBC shown in FIG. 28 adjusts, in data writing, the substrate potentials of both the P channel MOS transistors and the N channel MOS transistors of the memory cells in the selected column to adjust the threshold voltages.

Figure 30:
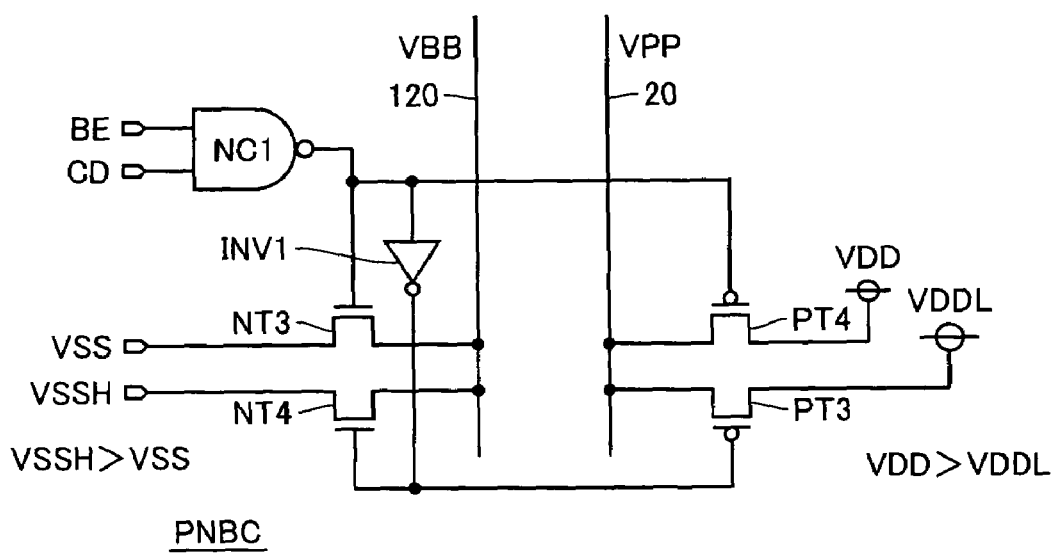
FIG. 30 shows a configuration of the substrate control circuit shown in FIG. 28.

FIG. 30 shows a configuration of PN substrate control circuit PNBC shown in FIG. 28. Referring to FIG. 30, PN substrate control circuit PNBC includes a NAND circuit NC1 receiving substrate control signal BE and column select signal CD, an inverter INV1 receiving an output signal of NAND circuit NC1, an N channel MOS transistor NT3 selectively rendered conductive in accordance with an output signal of NAND circuit NC1 to couple a low voltage source VSS to substrate voltage transmission line 120, an N channel MOS transistor NT4 rendered conductive complementarily to MOS transistor NT3 in accordance with an output signal of inverter INV1, to transmit ground voltage VSS to substrate voltage transmission line 120, a P channel MOS transistor PT3 selectively rendered conductive in accordance with an output signal of inverter INV1, to couple low voltage source VDDL to substrate voltage transmission line 20, and a P channel MOS transistor PT4 rendered conductive complementarily to MOS transistor PT3 in accordance with the output signal of NAND circuit NC1, to couple power supply VDD to substrate voltage transmission line 20.

High ground voltage VSSH is a voltage higher than ground voltage VSS. Low power supply voltage VDDL is a voltage lower than power supply voltage VDD.

Substrate voltage transmission line 20 is commonly coupled to the substrate regions of the P channel MOS transistors of the memory cells arranged in alignment in one column. Substrate voltage transmission line 120 is commonly coupled to the substrate regions of the N channel MOS transistors of the memory cells arranged in alignment in one column.

The configuration of PN substrate control circuit PNBC is equivalent to a circuit configuration of the combination of the substrate control circuits PBC and NBC shown in FIGS. 5 and 21.

Figure 31:
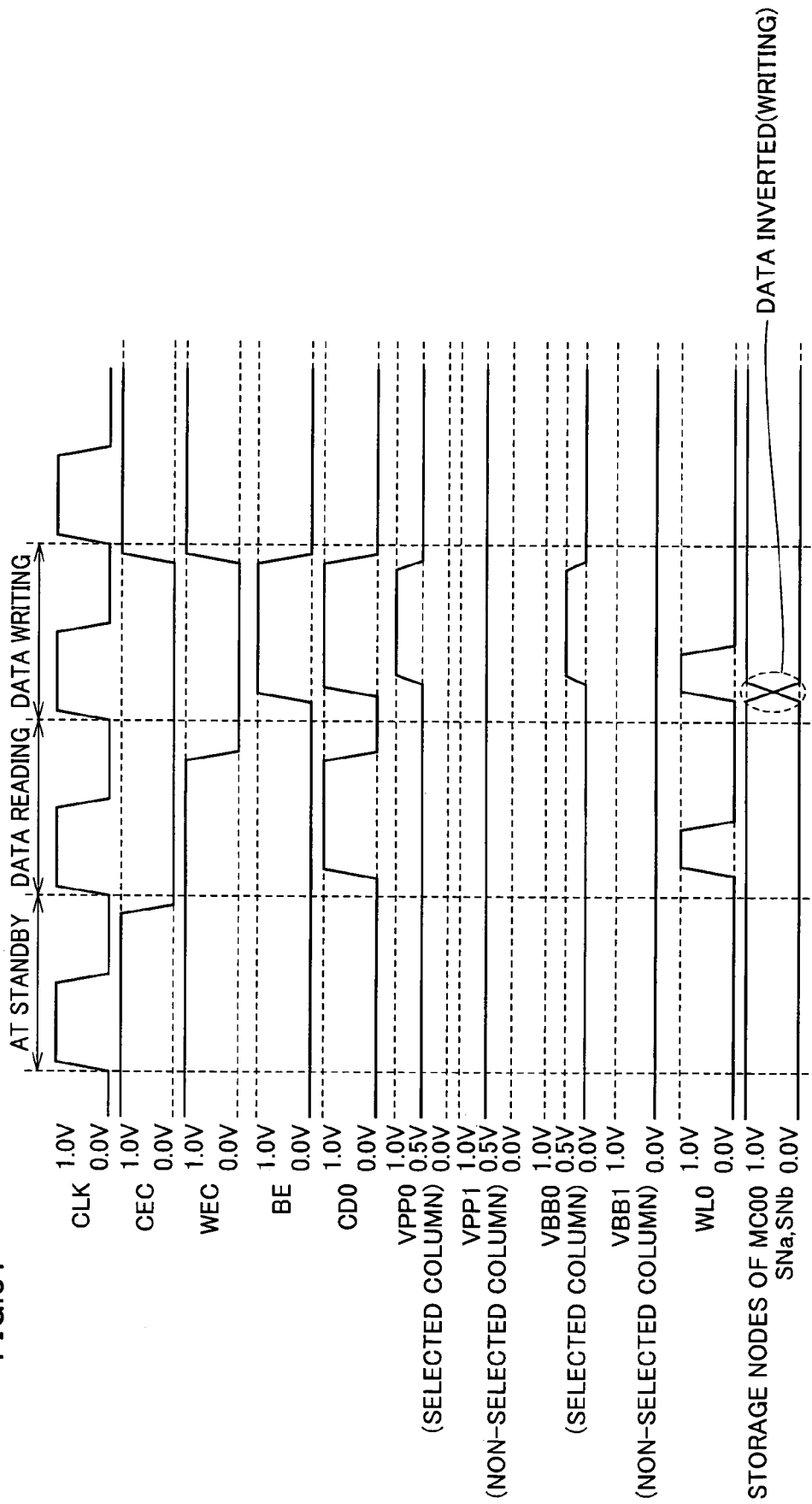
FIG. 31 is a timing chart representing an operation of the semiconductor memory device shown in FIG. 28.

FIG. 31 is a signal waveform diagram representing an operation of the semiconductor memory device when PN substrate control circuit PNBC shown in FIG. 30 is employed. Now, an operation of the semiconductor memory device including the PN substrate control circuit PNBC of FIG. 30 is described with reference to FIG. 31. Voltages VSSH and VDDL each are 0.5 V, power supply voltage VDD is 1.0 V, and ground voltage VSS is 0 V.

The operation shown in FIG. 31 is same as a combination of the operations represented by the timing charts of FIGS. 6 and 22. The operations described in the second and sixth embodiments are performed in parallel. Specifically, in a non-selected state and in non-writing of data, the output signal of NAND circuit NC1 is at an H level, and N channel MOS transistor NT3 and P channel MOS transistor PT3 are rendered conductive. Accordingly, the voltage VDDL of low voltage source VDDL is transmitted to substrate voltage transmission line 20 as bias voltage VPP, and the voltage VSS of ground voltage source VSS is transmitted to substrate voltage transmission line 120 as bias voltage VBB. Accordingly, in memory cell MC, the substrate biases of the P channel MOS transistors are made shallow, while the substrate biases of the N channel MOS transistors are made deep. In other words, the absolute values of the threshold voltages of the P channel MOS transistors become low, and the threshold voltages of the N channel MOS transistors become high. Accordingly, the current driving capabilities of the P channel MOS transistors are made large, while the current driving capabilities of the N channel MOS transistors are made small. Thus, memory cell MC holds data stably.

In data writing, substrate control signal BE rises to an H level. Column select signal CD for a selected column attains an H level, and the output signal of NAND circuit NC1 attains an L level. Accordingly, in PN substrate control circuit PNBC provided for the selected column, N channel MOS transistor NT4 and P channel MOS transistor PT4 are rendered conductive, and MOS transistors NT3 and PT3 are rendered non-conductive. Substrate voltage transmission line 20 is coupled to high voltage source (power supply voltage source) VDD via P channel MOS transistor PT4, and substrate voltage transmission line 120 is coupled to high voltage source (ground voltage source) VSSH via MOS transistor NT4. In the selected memory cells MC00 and MC10, the substrate potentials of P channel MOS transistors PQa and PQb (refer to FIG. 29) rise, and in response, the substrate biases become deep, and the absolute values of the threshold voltages increase. In response, the current driving capabilities of P channel MOS transistors PQa and PQb decrease. On the other hand, the substrate biases of N channel MOS transistors NQa–NQd become shallow, their threshold voltages decrease, and the current driving capabilities increase. Accordingly, in memory cell MC00 in the selected column, the input logic threshold value of each inverter becomes small, and the static noise margin also becomes small. The data holding stability decreases, and thus, data can readily be written.

In memory cell MC01 and others in non-selected columns, substrate bias voltages VPP and VBB have their voltage levels unchanged and therefore at low voltages VDDL and VSS. The substrate biases of the P channel MOS transistors are shallow, and the substrate biases of the N channel MOS transistors are deep. The input logic thresholds of inverters is high, and accordingly, data are held stably.

When the data writing is completed, substrate control signal BE or column select signal CD is driven to a non-selected state of an L level. In substrate control circuit PNBC of the selected column, the output signal of NAND circuit NC1 returns to an L level, and substrate voltage transmission lines 20 and 120 are again coupled to low voltage sources VDDL and VSS, respectively, and the written data is held stably.

In the ninth embodiment, substrate voltage transmission lines 20 and 120 may be driven in a one-shot fashion upon completion of data writing, or a configuration utilizing an external voltage may be employed.

For the substrate bias voltages VPP and VBB, voltages Vap and Vbp may be used as substrate bias voltage VPP and voltages Vbn and Van may be used as substrate bias voltage VBB, conditioned that the relations of Vap>Vbp and Van>Vbn both hold and that the PN junction between the impurity region and the substrate region of the MOS transistor of a memory cell is maintained in an off state.

As described above, according to the ninth embodiment of the present invention, in data writing, the substrate potentials of the memory cells in a selected column are changed for both the P channel and N channel MOS transistors. Thus, it is possible to write data at high speed with the static noise margin made sufficiently small.

Tenth Embodiment

Figure 32:
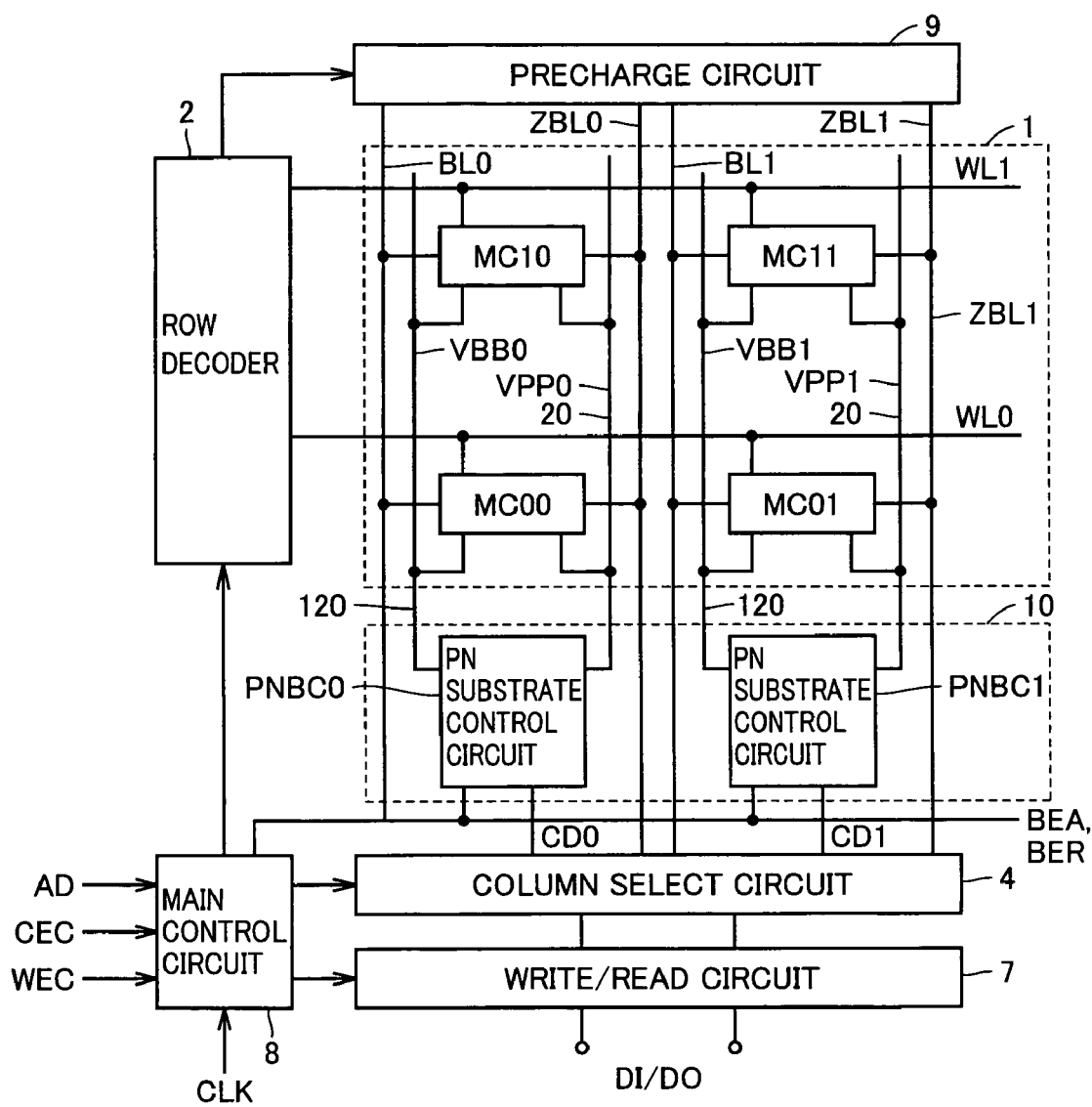
FIG. 32 schematically shows an overall configuration of a semiconductor memory device according to a tenth embodiment of the present invention.

FIG. 32 schematically shows an overall configuration of a semiconductor memory device according to a tenth embodiment of the present invention. The semiconductor memory device shown in FIG. 32 differs in configuration from the semiconductor memory device shown in FIG. 28 in the following points. Specifically, main control circuit 8 generates a substrate control signal BEA that is activated in an access cycle to control the substrate voltage VBB of the N channel MOS transistors and a P substrate control signal BER that is activated in data reading to control the substrate bias voltage VPP of the P channel MOS transistors.

In substrate potential setting circuit 10, PN substrate control circuit PNBC is arranged corresponding to each respective memory cell column. PN substrate control circuit PNBC changes both substrate bias voltages VPP and VBB of the P channel and N channel MOS transistors in a selected column in data reading, and changes substrate bias voltage VBB of the N channel MOS transistors of the memory cells in the selected column in data writing.

The other configuration of the semiconductor memory device shown in FIG. 32 is identical to that of the semiconductor memory device shown in FIG. 28, and therefore, the corresponding portions are denoted by the same reference characters and detailed description thereof is not repeated.

Further, the configuration of memory cell MC is identical to that of the memory cell shown in FIG. 29, and thus, in the following description, FIG. 29 is referred to as needed.

Figure 33:
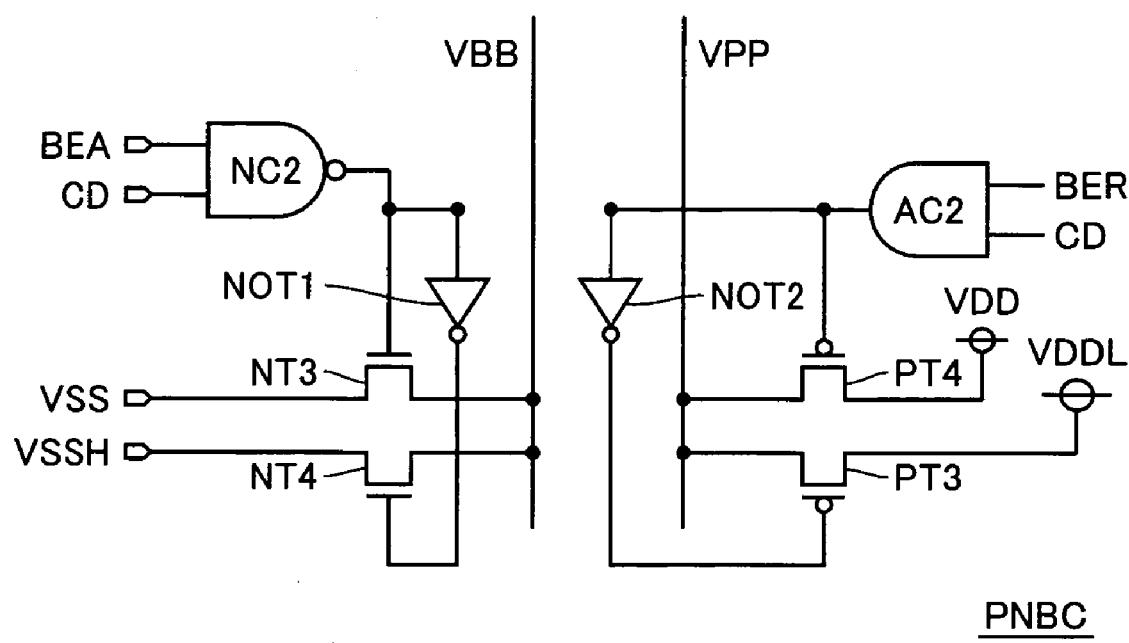
FIG. 33 shows a configuration of the substrate control circuit shown in FIG. 32.

FIG. 33 shows an example of a configuration of the PN substrate control circuit PNBC shown in FIG. 32. Referring to FIG. 33, PN substrate control circuit PNBC includes a NAND circuit NC2 receiving a substrate control signal BEA and a column select signal CD, an inverter NOT1 receiving an output signal of NAND circuit NC2, a pass transistor NT3 rendered conductive when an output signal of NAND circuit NC2 is at an H level to transmit ground voltage VSS to substrate voltage transmission line 120, and a pass transistor NT4 rendered conductive when an output signal of inverter NOT1 is at an H level to transmit high ground voltage VSSH to substrate voltage transmission line 120. Pass transistors NT3 and NT4 are each formed of an N channel MOS transistor.

Substrate control signal BEA is activated to an H level in an access cycle. Thus, in data writing and in data reading, substrate bias voltage VBB for a selected column is set to the high ground voltage VSSH level.

PN substrate control circuit PNBC further includes an AND circuit AC2 receiving a P substrate control signal BER and column select signal CD, an inverter NOT2 receiving an output signal of AND circuit AC2, a pass transistor PT3 rendered conductive when an output signal of inverter NOT2 is at an L level to transmit low power supply voltage VDDL to substrate voltage transmission line 20, and a pass transistor PT4 rendered conductive when an output signal of AND circuit AC2 is at an L level to transmit power supply voltage VDD to substrate voltage transmission line 20. Pass transistors PT3 and PT4 are each formed of a P channel MOS transistor.

P substrate control signal BER is activated to an H level in a data read cycle. Thus, in data reading, substrate bias voltage VPP of the memory cells in a selected column is set to the low power supply voltage VDDL level. In data writing, P substrate control signal BER is at an L level, and in response, the output signal of AND circuit AC2 is at an L level for the selected and non-selected columns, and therefore, substrate bias voltage VPP is maintained at the power supply voltage VDD level.

Figure 34:
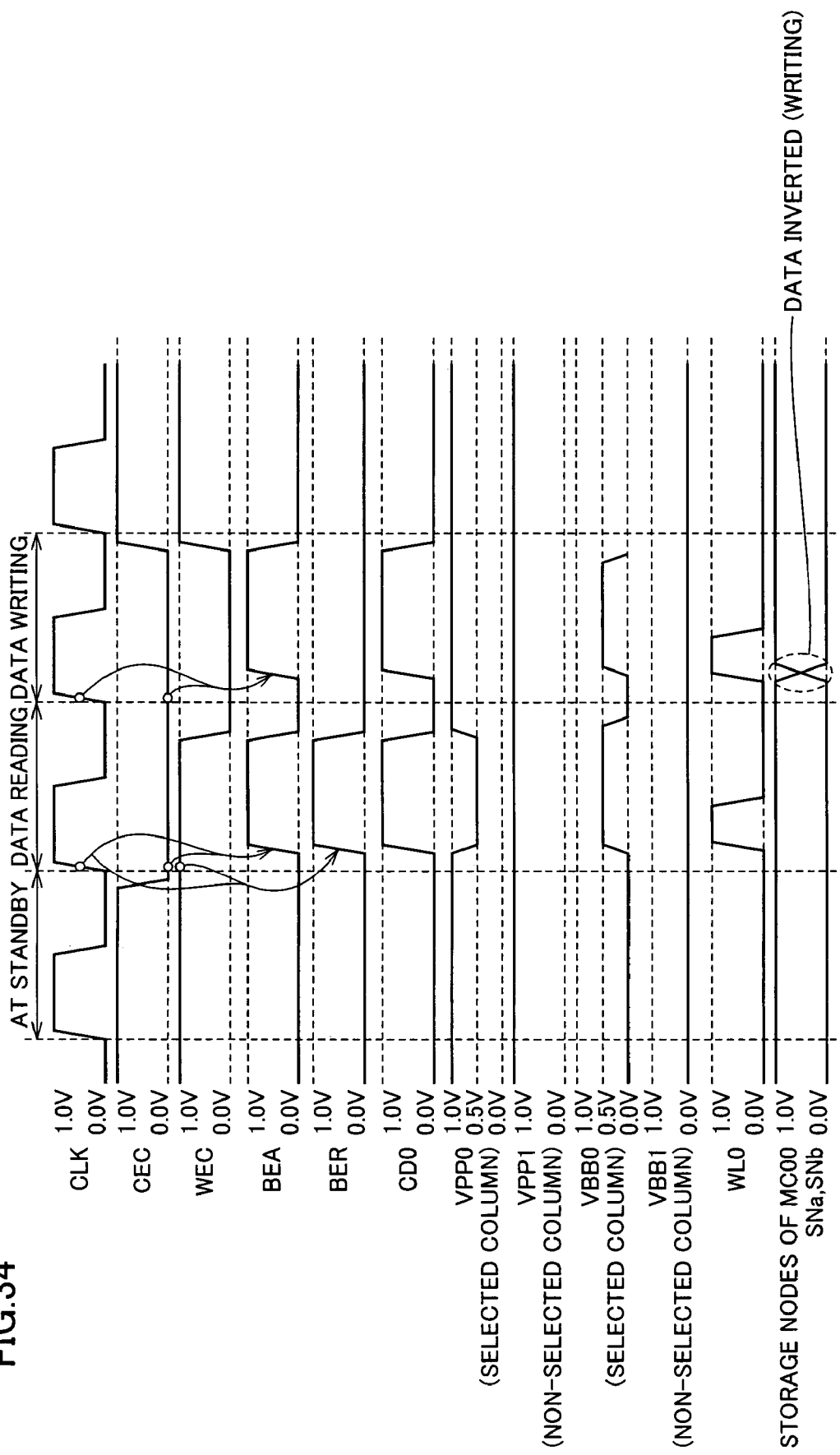
FIG. 34 is a timing chart illustrating an operation of the semiconductor memory device shown in FIG. 32.

FIG. 34 is a timing chart representing an operation of the semiconductor memory device shown in FIG. 32. Now, the operation of the semiconductor memory device shown in FIG. 32 is described with reference to FIG. 34. In the following description, it is assumed that memory cell MC00 is selected in a data access cycle.

In the standby state, cell enable signal CEC is at an H level, and write enable signal WEC is also at an H level. In this state, substrate control signals BEA and BER are both at an L level. Thus, in substrate control circuit PNBC, the output signal of NAND circuit NC2 is at an H level, and ground voltage VSS (0.0 V) is transmitted to substrate voltage transmission line 120 via pass transistor NT3. The output signal of AND circuit AC2 is at an L level, and power supply voltage VDD (1.0 V) is supplied to substrate voltage transmission line 20 via pass transistor PT4.

The absolute values of the threshold voltages of the MOS transistors in a memory cell are made large to reduce the leakage current.

In this case, even if the current driving capabilities of the MOS transistors in the memory cell are reduced, the word lines are in a non-selected state, and therefore, the data holding characteristics of the memory cells are not adversely influenced.

For a memory cell in a non-selected column in data writing and reading operations, in PN substrate potential control circuit PNBC shown in FIG. 33, column select signal CD is at an L level and the output signal of NAND circuit NC2 is at an H level. Further, the output signal of AND circuit AC2 is at an L level, and bias voltages VBB and VPP are maintained at the voltage levels the same as those in the standby state. In the memory cell in the non-selected row, the corresponding word line WL is in a non-selected state, and the internal storage nodes SNa and SNb are isolated from the bit lines. Thus, there is no adverse effect on the data retention, and the leakage current can also be suppressed.

In memory cell MC01 in the non-selected column on the selected row, storage nodes SNa and SNb are connected to the corresponding bit lines BL1 and ZBL1, and therefore, t is necessary to take the static noise margin into consideration. For the memory cell MC01, substrate bias voltages VBB and VPP are the same voltages as in the standby state. The static noise margin is greater due to increased absolute values of the threshold voltages of the memory cell transistors, ensuring stable data retention. Thus, if the absolute values of the threshold voltages of the N- and P-channel MOS transistors are set to be sufficiently large when substrate bias voltage VBB is at a ground voltage VSS (0.0 V)

level and substrate bias voltage VPP is at a power supply voltage VDD (1.0 V) level, then the static noise margin of memory cell MC01 in the non-selected column of the selected row can be secured sufficiently.

In data reading, substrate control signals BEA and BER are both activated. Column select signal CD attains an H level, and in response, the output signal of NAND circuit NC2 attains an L level. Substrate bias voltage VBB of substrate voltage transmission line 120 turns high ground voltage VSSL, and the substrate biases of the N channel MOS transistors of the memory cells in the selected column are made shallow to decrease the threshold voltages thereof and to increase the current driving capabilities. On the other hand, the output signal of AND circuit AC2 attains an H level, and substrate bias voltage VPP of substrate voltage transmission line 20 turns low power supply voltage VDDL by pass transistor PT3. In response, the absolute values of the threshold voltages of the P channel MOS transistors of the memory cell decrease to increase the current driving capabilities. When the absolute values of the threshold voltages of P channel MOS transistors PQa and PQb are small and the threshold voltages of N channel MOS transistors NQa–NQd are small, the data holding characteristics of the memory cell are considerably degraded. Thus, in the selected column, the substrate biases of the P and N channel MOS transistors are made shallow and the absolute values of the threshold voltages are made small to secure the static noise margin. Accordingly, it is possible to perform stable data reading for the selected memory cell.

In data writing, substrate control signal BEA is activated, while P substrate control signal BER is maintained at an inactive state. Thus, in PN substrate control circuit PNBC, the output signal of AND circuit AC2 is fixed to an L level, and substrate bias voltages VPP for the selected column and the non-selected columns are maintained at a power supply voltage VDD level as in the standby state. The current driving capabilities of the P channel MOS transistors of the memory cells are made small.

On the other hand, substrate control signal BEA is activated, and thus, in the selected column, the output signal of NAND circuit NC2 attains an L level. As in the case of data reading, substrate bias voltage VBB for the selected column attains high ground voltage VSSH by pass transistor NT4, and the substrate biases of the N channel MOS transistors become shallow. In this condition, the absolute values of the threshold voltages of the P channel MOS transistors are small, and the static noise margin of the memory cells on the selected column decreases, and data can be written into selected memory cell MC00 at high speed.

As for memory cell MC10 in the non-selected row in the selected column, the corresponding word line WL1 is in a non-selected state, and the storage nodes are isolated from the corresponding bit lines. Therefore, even if the static noise margin decreases, data is held stably without any problem.

As described above, in the standby state, the substrate biases of the MOS transistors of the memory cell are made deep to increase the absolute values of the threshold voltages, and the leakage current is reduced to decrease the current dissipation.

In the data reading and writing operations, the absolute values of the threshold voltages of the transistors of the memory cells in the non-selected column are made large, and the leakage current can be reduced. In particular, in the memory cell in the selected row on the non-selected column, the current driving capabilities of the MOS transistors of the memory cell are made small. Thus, the potential changing speed of the corresponding bit lines is slow, and the potential change of the bit lines can be made small. As a result, the consumed current associated with charge/discharge of the bit lines during the operation can be reduced.

In the selected column, the current driving capabilities of the N channel MOS transistors of the memory cell are made large. Both discharging of the bit lines in accordance with the stored data and discharging of the storage nodes in accordance with the written data can be performed at high speed. Thus, both high-speed data reading and data writing can be achieved.

Figure 35:
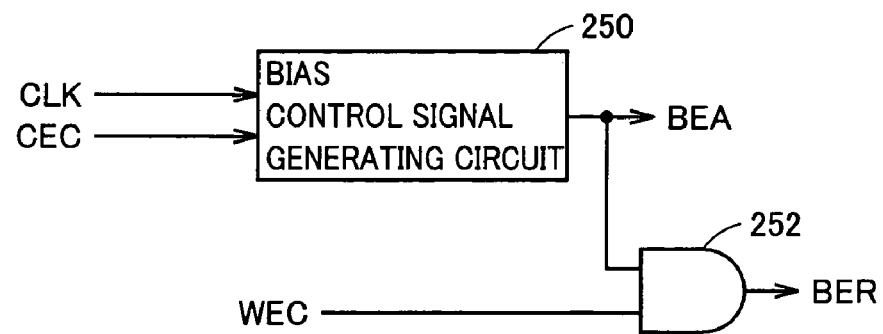
FIG. 35 schematically shows a configuration of the portion generating a substrate control signal shown in FIG. 32.

FIG. 35 schematically shows a configuration of a portion generating substrate control signals BER and BEA shown in FIG. 33. This substrate control signal generating portion is provided in main control circuit 8 shown in FIG. 32. Referring to FIG. 35, the substrate control signal generating portion includes a bias control signal generating circuit 250 for generating substrate control signal BEA in accordance with clock signal CLK and cell enable signal CEC, and an AND circuit 252 receiving substrate control signal BEA and write enable signal WEC to generate P substrate control signal BER.

Bias control signal generating circuit 250 is formed, e.g., of a one-shot pulse generating circuit, and generates a pulse signal having a prescribed time width at a prescribed timing when both clock signal CLK and cell enable signal CEC rise.

In data reading, write enable signal WEC is at an H level, and P substrate control signal BER is generated in accordance with substrate control signal BEA. In data writing, write enable signal WEC is at an L level, and P substrate control signal BER is maintained at an L level.

As described above, according to the tenth embodiment of the present invention, the substrate biases of the N channel MOS transistors in a selected column are made shallow in data writing, and the substrate biases of the P channel and N channel MOS transistors in the selected column are made shallow in data reading. Thus, data writing and data reading can be performed at high speed, and the current dissipation in the standby state can also be reduced.

Eleventh Embodiment

Figure 36:
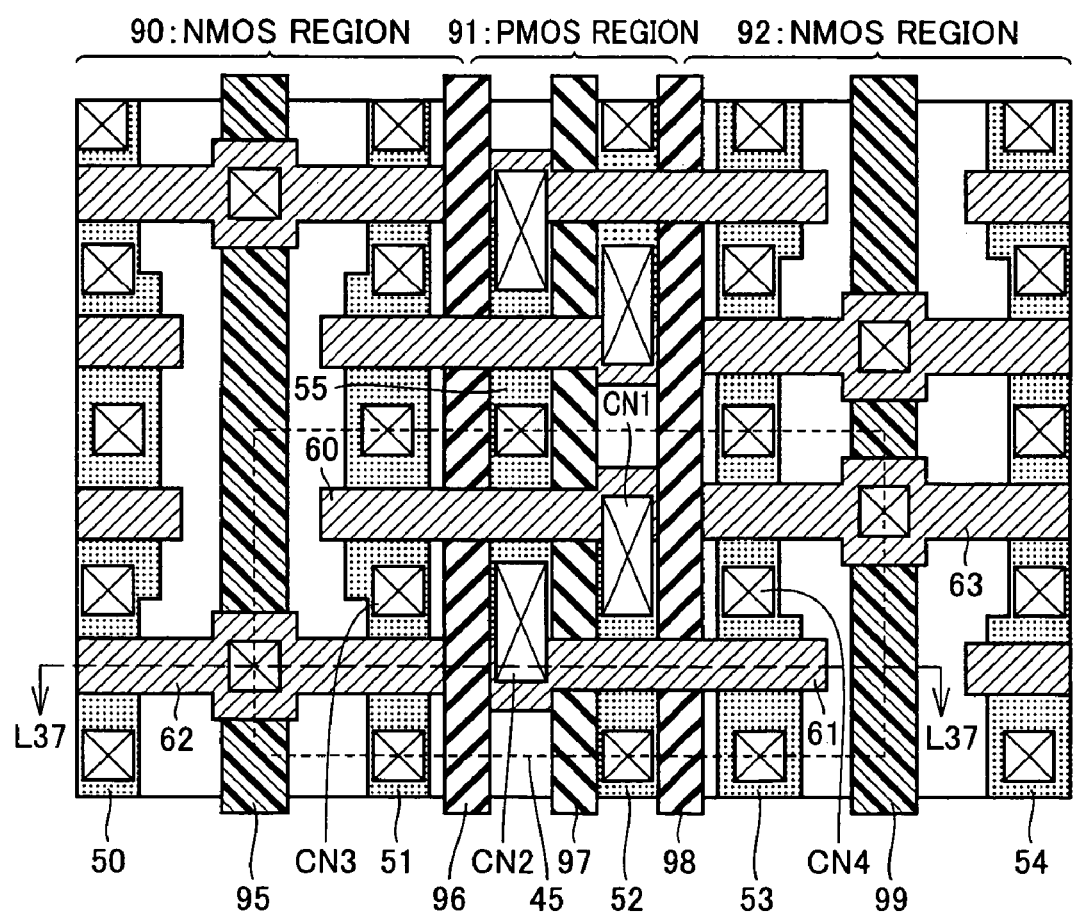
FIG. 36 schematically shows layout of a memory cell array according to an eleventh embodiment of the present invention.

FIG. 36 schematically shows layout of the memory cells according to an eleventh embodiment of the present invention. In the layout of the memory cells shown in FIG. 36, the regions for forming MOS transistors are separated for respective memory cell columns, and the substrate bias voltages VBB and VPP for the P channel and N channel MOS transistors can be changed in units of memory cell columns.

Referring to FIG. 36, NMOS regions 90 and 92 for forming N channel MOS transistors are provided on both sides of a PMOS region 91 for forming P channel MOS transistors. In the eleventh embodiment, a silicon on insulator (SOI) structure is employed. In other words, PMOS region 91 and NMOS regions 90 and 92 are each delimited by a substrate region formed on a buried insulating film not shown.

In NMOS region 90, an element isolation region 95 is arranged extending linearly in the column direction for isolating the memory cells in the adjacent columns. An element isolation region 96 is formed between NMOS region 90 and PMOS region 91 to isolate them. Element isolation region 96 is arranged extending in the column direction In PMOS region 91, an element isolation region 97 is formed isolating the active regions 55 and 52. An element isolation region 98 is formed extending in the column direction to isolate PMOS region 91 and NMOS region 92. In NMOS region 92, an element isolation region 99 for isolating the memory cells in adjacent columns is arranged extending linearly in the column direction. Element isolation regions 95–99 each have a trench isolation structure.

The layout of the memory cells in the present embodiment is the same as in the fourth embodiment. With a lateral cell structure employed, the memory cells are arranged in the same layout as that shown in FIG. 9. Thus, the corresponding portions in FIGS. 9 and 36 are denoted by the same reference characters or numerals, and detailed description thereof is not repeated.

Figure 37:
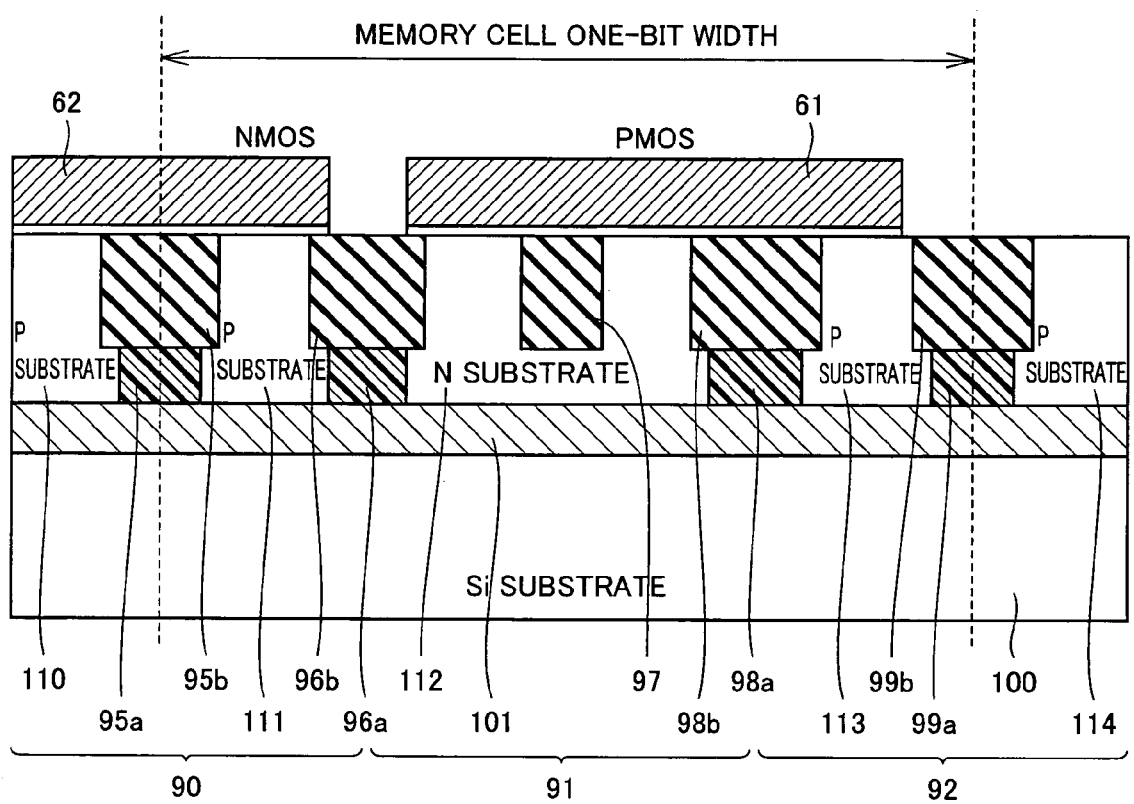
FIG. 37 schematically shows a cross-sectional structure taken along the line L37—L37 shown in FIG. 36.

FIG. 37 schematically shows a cross sectional structure taken along the line L37—L37 shown in FIG. 36. Referring to FIG. 37, a buried insulating film 101 is formed on a silicon (Si) substrate 100. P substrates 110 and 111 constituting NMOS region 90 are formed on buried insulating film 101. P substrates 110 and 111 are isolated by element isolation region 95. Element isolation region 95 includes a buried trench region 95a for complete isolation that is formed on buried insulating film 101, and a partial trench isolation region 95b of a shallow trench isolation structure that is formed on trench region 95a.

PMOS region 91 is defined by an N substrate 112 formed on buried insulating film 101. Element isolation region 97 is provided at the surface of N substrate 112 to separate the P channel MOS transistors. Element isolation region 97 is formed of a shallow trench isolation film and has a "partial trench isolation" structure.

Element isolation region 96 formed between PMOS region 91 and NMOS region 90 includes a buried trench isolation region 96a and a partial trench isolation region 96b formed thereon. Thus, element isolation region 96 reaches buried insulating film 101, implementing a "complete trench isolation" structure. N substrate 112 and P substrate 111 are isolated completely. N substrate 112 is commonly provided for the P channel MOS transistors of the memory cells arranged in alignment in one column.

Element isolation region 98 between PMOS region 91 and NMOS region 92 also includes a buried trench region 98a for complete trench isolation and a partial trench isolation region 98b formed thereon. Element isolation region 98 reaches buried insulating film 101 and implements the "complete trench isolation" structure completely isolating N substrate 112 from P substrate 113.

In NMOS region 92, P substrates 113 and 114 are arranged, which are isolated by element isolation region 99. Element isolation region 99 includes a buried trench isolation region 99a for implementing complete trench isolation, and a partial trench isolation region 99b formed thereon. Element isolation region 99 reaches buried insulating film 101 and completely isolates P substrates 113 and 114.

In this structure, as will be described later, substrate regions of P channel and N channel MOS transistors are isolated in units of memory cell columns. Upon control of the substrate voltages, as shown in the ninth and tenth embodiments, the substrate voltages VPP and VBB of both the P channel and N channel MOS transistors can be controlled in units of columns.

A gate electrode 61 is arranged on N substrate 112 and P substrate 113, and thus implements an inverter structure of the memory cell. Similarly, a gate electrode 62 is formed on P substrates 111 and 110, and forms the gates of the access transistors of adjacent memory cells. P substrates 110, 111, 113 and 114 for forming N channel MOS transistors are isolated for each column by the complete trench isolation structure, and thus, it is impossible to control the threshold voltages of the N channel MOS transistors of the memory cells in units of columns by adjusting their substrate potentials.

N substrate 101 is separated from a P substrate by another P substrate, and thus, substrate bias voltage VPP can be controlled in units of memory cell columns.

As a configuration for applying substrate bias voltages VPP and VBB to the respective substrate regions, the configurations shown in FIGS. 14 and 27 can be applied to the SOI structure.

As described above, according to the eleventh embodiment of the present invention, N substrate 112 is so formed as to extend continuously in the column direction and to be provided commonly for the memory cells of one column. Thus, the substrate potential VPP of the P channel MOS transistors of the memory cells can be adjusted in units of columns. Further, the P substrate extending in the column direction is isolated from another P substrate for forming N channel MOS transistors of the adjacent column by an element isolation region to achieve complete trench isolation. The substrate voltage VBB of the N channel MOS transistors can be adjusted in units of columns.

In particular, with the SOI structure employed, the body regions (back gates) of the MOS transistors are completely isolated from substrate 100. Thus, the junction capacitance of the substrate region is significantly decreased, and the potential change of the substrate region can be performed at high speed. Further, with the SOI structure, the parasitic capacitances of the interconnection lines and the transistors are small, and a high-speed operation can be achieved under a low power supply voltage condition, and therefore, the power supply voltage can be made low. Accordingly, the voltage of N substrate 112 can be decreased, and the current dissipation can be reduced.

Further, since substrate 100 and the back gates (body regions) of the MOS transistors are isolated, it is possible to prevent the influence of the substrate noise from exerting on the storage nodes, and thus, the soft error immunity can be improved.

As described above, according to the present invention, the substrate potentials of the transistors of the memory cells in a selected column in data writing are changed to reduce the static noise margin, and thus, data can be written reliably without impairing stability of data retention. Thus, for a miniaturized memory cell, data can be held stably and also written/read stably even under a low power supply voltage condition.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells, arranged in rows and columns, each including a latch circuit formed of insulated gate type field effect transistors of first and second conductivity types each having a back gate; and
   substrate potential changing circuitry for changing a back gate potential of at least the insulated gate type field effect transistor of the first conductivity type of a selected memory cell in a data writing from said back gate potential in a data reading in response to an address signal and an operation mode designating signal.

2. The semiconductor memory device according to claim 1, wherein
said insulated gate type field effect transistor of the first conductivity type is a P channel insulated gate type field effect transistor, and
said substrate potential changing circuitry sets the back gate potential of the P channel insulated gate type field effect transistor of said selected memory cell in said data writing to a voltage level higher than in said data reading.

3. The semiconductor memory device according to claim 2, wherein said substrate potential changing circuitry sets the back gate potential of said P channel insulated gate type field effect transistor to an external interfacing power supply voltage level in said data writing.

4. The semiconductor memory device according to claim 2, wherein
each of the memory cells receives a power source voltage as a power supply voltage for high level data storage, and
said substrate potential changing circuitry sets the back gate potential of said P channel insulated gate type field effect transistor to said power source voltage level in said data writing and to a voltage level lower than said power source voltage in said data reading.

5. The semiconductor memory device according to claim 1, wherein
said substrate potential changing circuitry includes
a plurality of substrate voltage transmission lines, arranged corresponding to the respective memory cell columns, each coupled commonly to the back gates of the insulated gate type field effect transistors of the first conductivity type in a corresponding column, and
a plurality of substrate potential setting circuits, arranged corresponding to the respective columns, each for setting a voltage of a corresponding substrate voltage transmission line in response to said operation mode designating signal and a column select signal generated based on said address signal.

6. The semiconductor memory device according to claim 5, wherein
said insulated gate type field effect transistor of the first conductivity type is a P channel insulated gate type field effect transistor, and
said substrate potential changing circuitry makes a back gate potential of the P channel insulated gate type field effect transistor in a selected column higher than in the memory cell on a non-selected column when said operation mode designating signal designates the data writing.

7. The semiconductor memory device according to claim 1, wherein
said insulated gate type field effect transistor of the first conductivity type is an N channel insulated gate type field effect transistor, and
said substrate potential changing circuitry makes a back gate potential of the N channel insulated gate type field effect transistors lower than in the data reading when said operation mode designating signal designates the data writing.

8. The semiconductor memory device according to claim 7, wherein said substrate potential changing circuitry sets the back gate potential of said N type insulated gate type field effect transistor to a ground voltage level in said data writing.

9. The semiconductor memory device according to claim 7, wherein
each of the memory cells receives a ground voltage as a power supply voltage for low level data storage, and
said substrate potential changing circuitry sets the back gate potential of said N channel insulated gate type field effect transistor to a voltage level higher than said ground voltage in said data writing and to said ground voltage level in said data reading.

10. The semiconductor memory device according to claim 1, wherein
said substrate potential changing circuitry includes
a plurality of first substrate voltage transmission lines, arranged corresponding to the respective memory cell columns, each commonly coupled to the back gates of the insulated gate type field effect transistors of the first conductivity type of the memory cells on a corresponding column,
a plurality of second substrate voltage transmission lines, arranged corresponding to the respective columns, each commonly coupled to the back gates of the insulated gate type field effect transistors of the second conductivity type of the memory cells on the corresponding column, and
a plurality of substrate potential selecting circuits, arranged corresponding to the respective columns, each for setting voltages of corresponding first and second substrate voltage transmission lines in response to said operation mode designating signal and a column select signal generated based on said address signal.

11. The semiconductor memory device according to claim 10, wherein said substrate potential changing circuitry makes back gate potentials of the insulated gate type field effect transistors of the first conductivity type in a selected column higher while making back gate potentials of the insulated gate type field effect transistors of the second conductivity type lower when said operation mode designating signal designates data reading.

12. The semiconductor memory device according to claim 1, wherein
said substrate potential changing circuitry includes
a plurality of substrate voltage transmission lines, arranged corresponding to the respective memory cell columns, each for transmitting a bias voltage to the back gates of the insulated gate type field effect transistors of the first conductivity type of the memory cells on a corresponding column,
a plurality of substrate potential setting circuits, arranged corresponding to the respective memory cell columns, each for setting a potential of the substrate voltage transmission line in a corresponding column in accordance with said operation mode designating signal and said column select signal generated based on the address signal, and
a substrate potential auxiliary circuit for driving the potential of the substrate voltage transmission line on the selected column toward a prescribed potential for a prescribed time period in response to said operation mode designating signal and said column select signal.

13. The semiconductor memory device according to claim 1, wherein
the insulated gate type field effect transistor of the first conductivity type of the memory cell is formed in a first substrate region, and the insulated gate type field effect transistor of the second conductivity type of said memory cell is formed in a second substrate region,
the first and second substrate regions are each formed, continuously in a column direction, corresponding to each column, and form the back gates of the insulated gate type field effect transistors of the first and second conductivity type, respectively, of the memory cells arranged in a corresponding column, and said substrate potential changing circuitry changes a potential of at least one of said first and second substrate regions.

14. The semiconductor memory device according to claim 13, further comprising a power line extending continuously in a column direction and commonly coupled to the insulated gate type field effect transistors of the first conductivity type of the memory cells arranged in alignment in the column direction.

15. The semiconductor memory device according to claim 13, wherein said first and second substrate regions are formed on an insulating film, and said first and second substrate regions are isolated by a trench region.

16. The semiconductor memory device according to claim 15, wherein said first and second substrate regions are isolated in units of columns.

17. The semiconductor memory device according to claim 1, wherein said substrate potential changing circuitry changes a potential application manner of the back gates for said plurality of memory cells between a standby state, said data reading and said data writing, in response to said operation mode designating signal.

* * * * *